United States Patent
Woo et al.

(10) Patent No.: US 12,189,976 B2
(45) Date of Patent: Jan. 7, 2025

(54) APPARATUS FOR OUTPUTTING INTERNAL STATE OF MEMORY APPARATUS AND MEMORY SYSTEM USING THE APPARATUS

(71) Applicant: SAMSUNG ELECTRONICS CO., LTD., Suwon-si (KR)

(72) Inventors: Seong-Hoon Woo, Hwaseong-si (KR); Hak-Sun Kim, Suwon-si (KR); Kwang-Jin Lee, Hwaseong-si (KR); Su-Chang Jeon, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/506,293

(22) Filed: Nov. 10, 2023

(65) Prior Publication Data
US 2024/0078034 A1    Mar. 7, 2024

Related U.S. Application Data

(63) Continuation of application No. 17/231,734, filed on Apr. 15, 2021, now Pat. No. 11,847,339, which is a (Continued)

(30) Foreign Application Priority Data

Aug. 16, 2016  (KR) .......................... 10-2016-0103752

(51) Int. Cl.
*G11C 7/20*  (2006.01)
*G06F 3/06*  (2006.01)
(Continued)

(52) U.S. Cl.
CPC .......... *G06F 3/0653* (2013.01); *G06F 3/0604* (2013.01); *G06F 3/0679* (2013.01);
(Continued)

(58) Field of Classification Search
CPC ...... G06F 13/16; G06F 3/0653; G06F 3/0604; G11C 7/1063; G11C 7/20; G11C 7/22; G11C 16/20
See application file for complete search history.

(56) References Cited

U.S. PATENT DOCUMENTS

| | | |
|---|---|---|
| 5,524,231 A | 6/1996 | Brown |
| 6,282,121 B1 | 8/2001 | Cho et al. |

(Continued)

FOREIGN PATENT DOCUMENTS

| | | |
|---|---|---|
| CN | 101038789 A | 9/2007 |
| CN | 102110468 A | 6/2011 |

(Continued)

OTHER PUBLICATIONS

Communication dated Feb. 25, 2022, issued by the China National Intellectual Property Administration in counterpart Chinese Application No. 201710695642.1.

(Continued)

*Primary Examiner* — Uyen Smet
(74) *Attorney, Agent, or Firm* — Sughrue Mion, PLLC

(57) ABSTRACT

A memory system is provided and includes memory chips in each of which a first state output pin is arranged and a memory controller in which a first state input pin connected to a first channel including first ways respectively connected to the first state output pins arranged in the memory chips is arranged. The memory controller checks a first internal state of each of the memory chips, based on one or more of a chip enable signal and a CE reduction command of the memory chips, and a second signal received through the first state input pin as a result of an AND operation of first signals output through the first state output pins, during a state check interval for checking respective states of the memory chips.

19 Claims, 18 Drawing Sheets

Related U.S. Application Data continuation of application No. 16/503,116, filed on Jul. 3, 2019, now Pat. No. 11,003,382, which is a continuation of application No. 15/678,759, filed on Aug. 16, 2017, now Pat. No. 10,346,087.

(51) Int. Cl.

| | | |
|---|---|---|
| *G06F 13/16* | (2006.01) | |
| *G11C 7/10* | (2006.01) | |
| *G11C 7/22* | (2006.01) | |
| *G11C 16/20* | (2006.01) | |
| *G11C 16/32* | (2006.01) | |
| *G11C 16/04* | (2006.01) | |

(52) U.S. Cl.
CPC ............ *G06F 13/16* (2013.01); *G11C 7/1063* (2013.01); *G11C 7/20* (2013.01); *G11C 7/22* (2013.01); *G11C 16/20* (2013.01); *G11C 16/32* (2013.01); *G11C 16/0483* (2013.01)

(56) References Cited

U.S. PATENT DOCUMENTS

| | | |
|---|---|---|
| 6,788,112 B1 | 9/2004 | Chan et al. |
| 6,834,322 B2 | 12/2004 | Sukegawa et al. |
| 6,888,733 B2 | 5/2005 | Jang et al. |
| 7,349,245 B2 | 3/2008 | Kim et al. |
| 7,978,516 B2 | 7/2011 | Olbrich et al. |
| 8,151,039 B2 | 4/2012 | Lai et al. |
| 8,179,732 B2 | 5/2012 | Kang |
| 8,270,243 B2 | 9/2012 | Lee |
| 8,429,313 B2 | 4/2013 | Smith et al. |
| 8,433,845 B2 | 4/2013 | Borchers et al. |
| 8,996,759 B2 | 3/2015 | Chung |
| 2001/0016928 A1 | 8/2001 | Wada et al. |
| 2003/0021139 A1 | 1/2003 | Nakamura et al. |
| 2005/0114587 A1 | 5/2005 | Chou et al. |
| 2007/0005825 A1 | 1/2007 | Henson et al. |
| 2008/0079148 A1 | 4/2008 | Leung et al. |
| 2008/0205153 A1 | 8/2008 | Kwon et al. |
| 2010/0064074 A1 | 3/2010 | Hansquine |
| 2013/0176788 A1* | 7/2013 | Kim .................. G11C 15/046 365/185.18 |
| 2014/0122777 A1* | 5/2014 | Oh .................. G06F 3/061 711/103 |
| 2014/0176169 A1 | 6/2014 | Cheng |
| 2014/0250262 A1 | 9/2014 | Buxton et al. |
| 2014/0313831 A1 | 10/2014 | Kim |
| 2015/0187399 A1 | 7/2015 | Tuers et al. |
| 2016/0246514 A1 | 8/2016 | Nosaka et al. |
| 2017/0018296 A1 | 1/2017 | Jeong et al. |
| 2017/0286345 A1 | 10/2017 | Ikeda et al. |

FOREIGN PATENT DOCUMENTS

| | | |
|---|---|---|
| CN | 104103318 A | 10/2014 |
| JP | 2010-066946 A | 3/2010 |
| KR | 1020040097885 A | 11/2004 |
| KR | 1020090088125 A | 8/2009 |
| KR | 1020120061573 A | 6/2012 |

OTHER PUBLICATIONS

Korean Office Action, dated Nov. 22, 2022, issued by the Korean Patent Office, in App No. 10-2016-0103752.

\* cited by examiner

APPARATUS FOR OUTPUTTING INTERNAL STATE OF MEMORY APPARATUS AND MEMORY SYSTEM USING THE APPARATUS

CROSS-REFERENCE TO RELATED APPLICATION

This is a Continuation of U.S. application Ser. No. 17/231,734, filed Apr. 15, 2021, which is a Continuation of U.S. application Ser. No. 16/503,116, filed Jul. 3, 2019, now U.S. Pat. No. 11,003,382, which is a Continuation of U.S. application Ser. No. 15/678,759, filed Aug. 16, 2017, now U.S. Pat. No. 10,346,087, which claims priority from Korean Patent Application No. 10-2016-0103752, filed on Aug. 16, 2016, in the Korean Intellectual Property Office, the disclosures of each of which being incorporated by reference herein in their entireties.

BACKGROUND

Apparatuses and memory systems consistent with the present disclosure relate to an interface apparatus and method of a memory system, and more particularly, to an apparatus for outputting an internal state of a memory apparatus and a memory system using the apparatus.

In a memory system including one or more non-volatile memory apparatuses, a memory controller checks an internal state such as a ready/busy state of each of the non-volatile memory apparatuses in order to control the non-volatile memory apparatuses. In particular, in a memory system including multi-ways, the number of pads corresponding to read/busy pins needed by a memory controller to check an internal state according to the multi-ways is increased. Accordingly, there is a demand for technology for checking an internal state of each of the non-volatile memory apparatuses while reducing the number of pads of a memory controller and increasing an I/O speed.

SUMMARY

It is an aspect to provide an apparatus for rapidly identifying and outputting an internal state of each of memory apparatuses while reducing a number of pads of a controller in a memory system including multi-ways.

It is another aspect to provide a memory system for rapidly determining an internal state of each of memory apparatuses of multi-ways while reducing a number of pads of a controller.

According to an aspect of an exemplary embodiment, there is provided an apparatus for outputting a state signal of a memory apparatus, the apparatus including: a state signal generating circuit configured to generate a first signal indicating an internal operation state of the memory apparatus; and a state signal output control circuit configured to receive the first signal and output a second signal to an output pad based on at least one of a chip enable signal and an initially set function command, wherein the first signal indicates one state from among two states and the second signal indicates one state from among three states.

According to another aspect of an exemplary embodiment, there is provided a memory system including a plurality of memory chips in each of which at least one first state output pin is arranged; and a memory controller in which a first state input pin connected in a wired-AND configuration to the at least one first state output pin arranged in the plurality of memory chips is arranged, the memory controller being configured to transmit at least one of a chip enable signal and an initially set function command to the plurality of memory chips, wherein each of the plurality of memory chips outputs a first state signal having one level from among three logic levels according to a first internal operation state to the first state output pins based on at least one of the chip enable signal and the initially set function command.

According to another aspect of an exemplary embodiment, there is provided a memory system comprising a plurality of memory apparatuses, each comprising a first state output pin; and a memory controller coupled to the first state output pins of the memory apparatuses, the memory controller being configured to transmit at least one of a chip enable signal and an initially set function command to each of the plurality of memory chips, wherein, in response to receiving an enable signal of the at least one of the chip enable signal and the initially set function command, the memory apparatus outputs a first state signal based on a first internal operation state of the memory apparatus to the first state output pin of the memory apparatus, and in response to receiving a disable signal of the at least one of the chip enable signal and the initially set function command, the memory apparatus outputs a high impedance state.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION

The inventive concept will now be described more fully with reference to the accompanying drawings, in which exemplary embodiments are shown.

Figure 1:
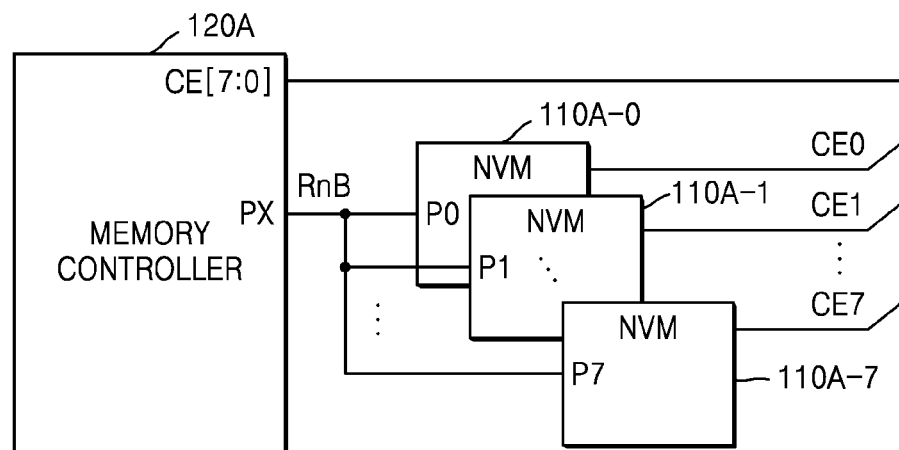
FIG. 1 is a diagram illustrating a configuration of a memory.

FIG. 1 is a diagram illustrating a configuration of a memory system 100A.

As shown in FIG. 1, the memory system 100A includes a plurality of memory apparatuses 110A-0 through 110A-7 and a memory controller 120A.

For example, in FIG. 1, eight memory apparatuses 110A-0 through 110A-7 constitute one channel. That is, in the memory system 100A of FIG. 1, one channel is comprised of eight ways.

The memory apparatuses 110A-0 through 110A-7 may be non-volatile memory devices. Examples of the memory apparatuses 110A-0 through 110A-7 may include flash memory devices, phase-change random-access memories (PRAMs), ferroelectric RAMs (FRAMs), and magnetic RAMs (MRAMs).

The memory apparatuses 110A-0 through 110A-7 output ready/busy signals RnB indicating internal states through pins P0 through P7, respectively, irrespective of a state of a chip enable signal CE[7:0]. The pins P0 through P7 of the memory apparatuses 110A-0 through 110A-7 are connected to a single RnB pin PX arranged in the memory controller 120A in a wired-AND configuration. Accordingly, the memory controller 120A receives the ready/busy signals RnB of the plurality of memory apparatuses 110A-0 through 110A-7 that constitute one channel through the single RnB pin PX.

A method of determining an internal state of each of the memory apparatuses 110A-0 through 110A-7 included in a same channel of the memory system 100A of FIG. 1 will now be explained with reference to FIG. 2.

Figure 2:
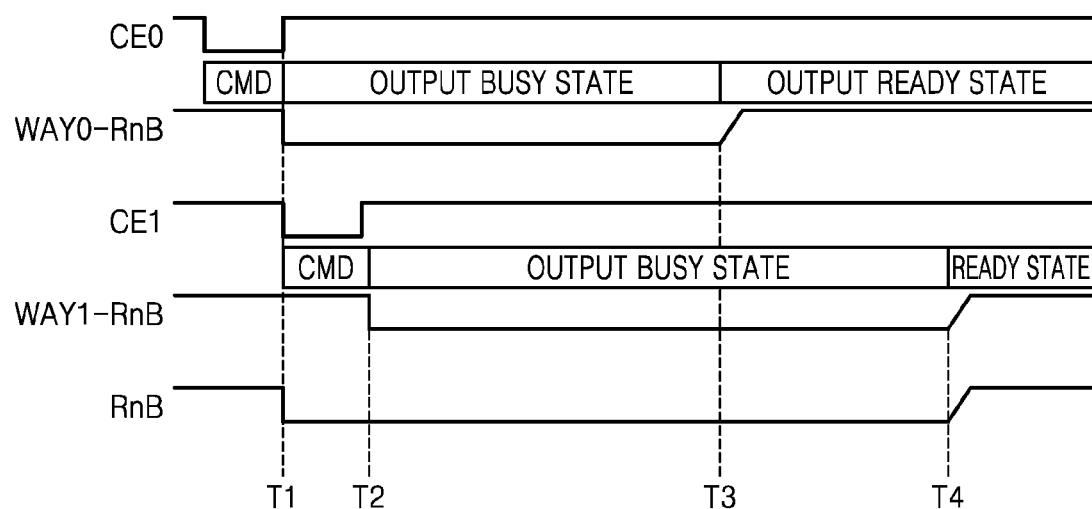
FIG. 2 is a diagram illustrating waveforms of signals for explaining an operation of determining an internal state of each of memory apparatuses in multi-ways of the memory system of FIG. 1.

FIG. 2 is a diagram illustrating waveforms of signals for explaining an operation of determining an internal state of each of memory apparatuses in multi-ways of the memory system 100A of FIG. 1. For reference, for convenience of explanation, the ready/busy signals RnB of the memory apparatus 110A-0 of a way 0 and the memory apparatus 110A-1 of a way 1 from among eight ways 0 through 7 are illustrated in FIG. 2. The ready/busy signals RnB of the memory apparatuses 110A-2 to 110A-7 operate similarly to the ready/busy signals RnB of the memory apparatuses 110A-0 and 110A-1 described with respect to FIG. 2 below.

Referring to FIG. 2, a busy state is output in an interval from T1 to T3 according to a ready/busy signal WAY0-RnB indicating an internal state of the memory apparatus 110A-0 of the way 0. A busy state is output in an interval from T2 to T4 according to a ready/busy signal WAY1-RnB indicating an internal state of the memory apparatus 110A-1 of the way 1.

Since the pins P0 through P7 of the memory apparatuses 110A-1 through 110A-7 are connected to the single RnB pin PX arranged in the memory controller 120A in a wired-AND configuration, when any of the ready/busy signals WAY0-RnB and WAY1-RnB is in a busy state LOW, the memory controller 120A maintains the ready/busy signal RnB received through the single RnB pin PX in a busy state. Accordingly, the memory controller 120A determines that at least one of the memory apparatuses is in a busy state in an interval from T1 to T4. However, the memory controller 120A does not determine in which way the memory apparatus is in a busy state in the interval from T1 to T4. In other words, since all the ways uses the single RnB pin PX, it is not possible for the memory controller 120A to determine which specific memory apparatus 110A-0 to 110A-7 is busy.

According to FIG. 2, since it may not be determined that the memory apparatus 110A-0 of the way 0 is in a ready state in an interval from T3 to T4, performance may be degraded. A memory system for compensating for performance degradation is illustrated in FIG. 3.

Figure 3:
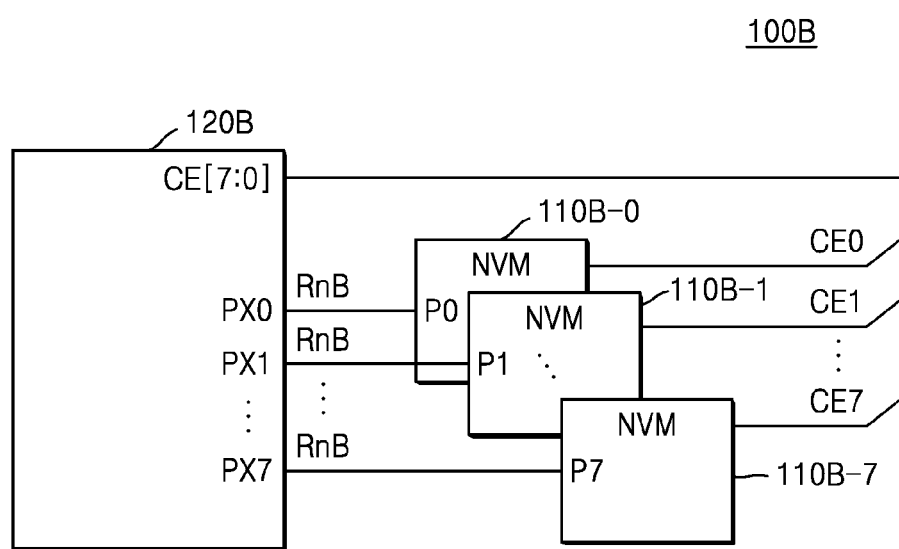
FIG. 3 is a diagram illustrating a configuration of another memory system.

FIG. 3 is a diagram illustrating a configuration of a memory system 100B.

As shown in FIG. 3, the memory system 100B includes a plurality of memory apparatuses 110B-0 through 110B-7 and a memory controller 120B.

Referring to FIG. 3, pins PX0 through PX7, the number of which is the same as the number of ways, are arranged in the memory controller 120B in order to determine an internal state (e.g., RnB) of each of the memory apparatuses 110B-0 through 110B-7. Accordingly, the memory controller 120B may individually identify internal states of the memory apparatuses 110B-0 through 110B-7 in multi-ways. However, in this configuration, the number of pins (and the number of corresponding pads) of the memory controller 120B is increased. For example, when eight ways constitute two channels, the memory controller 120B needs sixteen pads in order to determine whether one of the memory apparatuses is in a ready/busy state.

Figure 4:
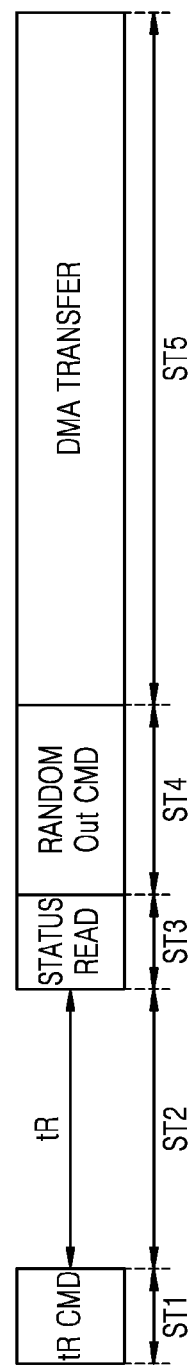
FIG. 4 is a timing diagram for explaining an operation of determining an internal state of each of memory apparatuses in multi-ways by using a state read command in the memory system of FIG. 1.

According to another method suggested to compensate for performance degradation illustrated in FIG. 4, an internal state of each of memory apparatuses in multi-ways may be determined by using a state read command in the memory system 100A of FIG. 1.

FIG. 4 is a timing diagram for explaining an operation of determining an internal state of each of memory apparatuses in multi-ways by using a state read command in the memory system 100A of FIG. 1.

Referring to FIG. 4, any one memory apparatus from among a plurality of memory apparatuses in multi-ways receives a read command during an interval ST1 and performs a data read operation according to the read command during an interval ST2. A memory controller checks a state of each of the memory apparatuses by using a state read command during an interval ST3. Next, a random out command CMD is received during an interval ST4, and data read from the memory apparatus is transmitted to the memory controller according to a direct memory access (DMA) operation during an interval ST5.

According to this operation, since the state read command is used in order to determine an internal state of each of the memory apparatuses in the multi-ways in the interval ST3, a command overhead is required. Also, the random out command CMD is additionally needed to output data after the state read command. Accordingly, a time taken to perform an operation of determining an internal state of each of the memory apparatuses in the multi-ways is increased. In particular, when the memory apparatuses in the multi-ways perform a high queue depth random read operation, a plurality of state read commands may be previously stored in a queue in order to read a state of each of the memory apparatuses. When a time taken to determine an internal state of a memory apparatus corresponding to each of the state read commands stored in the queue is increased, a speed at which the other commands stored in the queue are processed may be reduced.

According to various exemplary embodiments, a method of improving the efficiency of an operation of a memory apparatus including a high queue depth random read operation by addressing the disadvantages of a method of determining an internal state of each of memory apparatuses in multi-ways is suggested.

A method of determining an internal state of each of memory apparatuses in multi-ways divides an internal state of a memory apparatus into three states and outputs the divided internal state through an RnB pin according to a chip enable signal CE or an initially set function command (e.g., a CE reduction command). For example, the internal state may be divided into states 0, 1, and Hi-Z (high impedance).

Figure 5:
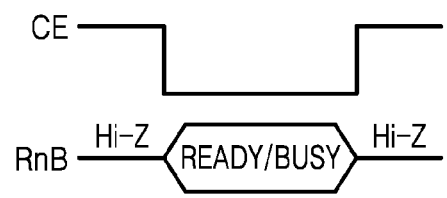
FIG. 5 is a diagram illustrating waveforms of signals for explaining a method of generating a state signal of each of memory apparatuses in multi-ways according to an exemplary embodiment.

FIG. 5 is a diagram illustrating waveforms of signals for explaining a method of generating a state signal of each of memory apparatuses in multi-ways according to an exemplary embodiment.

As shown in FIG. 5, the state 0 or 1 indicating an internal state (e.g., a ready/busy state) is output only during a chip enable interval (e.g., an interval where the chip enable signal CE is in a LOW state) based on the chip enable signal CE or the initially set function command (e.g., the CE reduction command). The RnB pin is in the state Hi-Z (high impedance) irrespective of the internal state of the memory apparatus during a chip disable interval (e.g., an interval where the chip enable signal CE is in a HIGH state).

Figure 6:
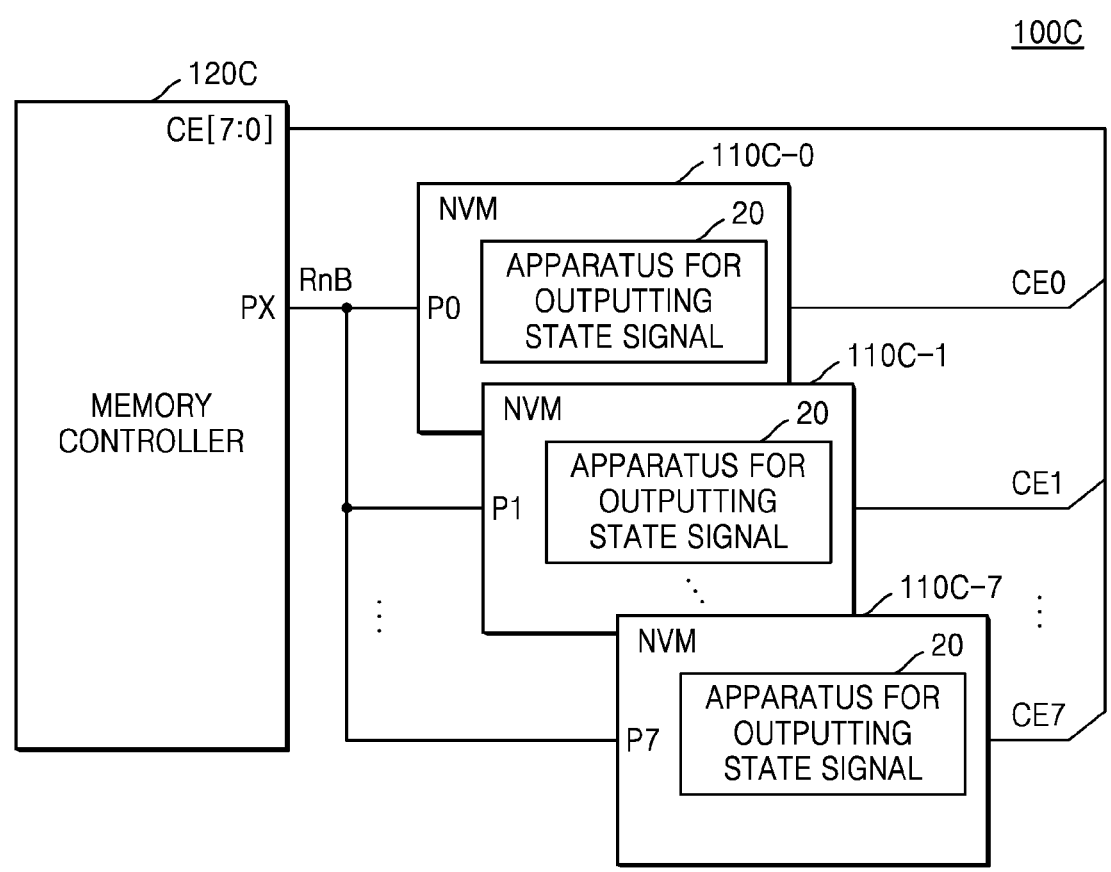
FIG. 6 is a diagram illustrating a configuration of a memory system to which a method of outputting a state signal is applied according to an exemplary embodiment.

FIG. 6 is a diagram illustrating a configuration of a memory system 100C to which a method of outputting a state signal is applied according to an exemplary embodiment.

As shown in FIG. 6, the memory system 100C includes a plurality of memory apparatuses 110C-0 through 110C-7 and a memory controller 120C.

For example, eight memory apparatuses 110C-0 through 110C-7 constitute one channel in FIG. 6. That is, in the memory system 100C of FIG. 6, one channel is comprised of eight ways. However, the inventive concept is not limited thereto, and one or more channels may be provided and each of the channels may be comprised of multi-ways.

The memory apparatuses 110C-0 through 110C-7 may be non-volatile memory devices. Examples of the memory apparatuses 110C-0 through 110C-7 may include flash memory devices, PRAMs, FRAMs, and MRAMs. The memory apparatuses 110C-0 through 110C-7 may be formed by combining at least one non-volatile memory device with at least one volatile memory device or by combining at least two types of non-volatile memory devices.

For example, each of the memory apparatuses 110C-0 through 110C-7 may include a single memory chip. One memory chip may include a single die or a plurality of dies. One die may include a single plane or a plurality of planes. One plane includes a plurality of memory blocks, each of the memory blocks includes a plurality of pages, and each of the pages includes a plurality of sectors. Each of the memory apparatuses 110C-0 through 110C-7 includes an apparatus 20 for outputting a state signal. State output pins P0 through P7 for outputting signals indicating internal states are respectively arranged in the memory apparatuses 110C-0 through 110C-7, respectively. For example, each of the state output pins P0 through P7 may be allocated to an RnB pin indicating a ready/busy state.

The apparatus 20 divides a signal indicating an internal operation state into three states based on a chip enable signal CE or an initially set function command (e.g., the CE reduction command), or both the chip enable signal CE and the initially set function command (e.g., the CE reduction command), and may output the divided signal to the state output pin (e.g., the RnB pin).

For example, the apparatus 20 outputs the state 0 or 1 indicating an internal state (e.g., a ready/busy state) to the state output pin in a chip enable interval based on the chip enable signal CE or the initially set function command (e.g., the CE reduction command). For example, a state 0 may indicate that the internal state is busy and a state 1 may indicate that the internal state is ready. In other exemplary embodiments, a state 0 may indicate the internal state is ready, and a state 1 may indicate that the internal state is ready. The state output pin has the state Hi-Z (high impedance) irrespective of an internal state of a memory apparatus in a chip disable interval.

The memory controller 120C generates the chip enable signal CE[7:0] for eight ways and transmits the chip enable signal CE[7:0] to the memory apparatuses 110C-0 through 110C-7. The state output pins P0 through P7 of the memory apparatuses 110C-0 through 110C-7, respectively, are connected to the single RnB pin PX arranged in the memory controller 120C in a wired-AND configuration.

Accordingly, the memory controller 120C may individually check an internal state of each of the memory apparatuses 110C-0 through 110C-7 through one RnB pin PX. In detail, the memory controller 120C may individually check an internal state of each of the memory apparatuses 110C-0 through 110C-7 in association with a logic state of a chip enable signal. For example, when a logic state indicating a busy state is detected at the RnB pin PX in an interval where a chip enable signal of the way 0 has an enable logic state, the memory controller 120C may determine that the memory apparatus 110C-0 of the way 0 in multi-ways is in a busy state.

Figure 7:
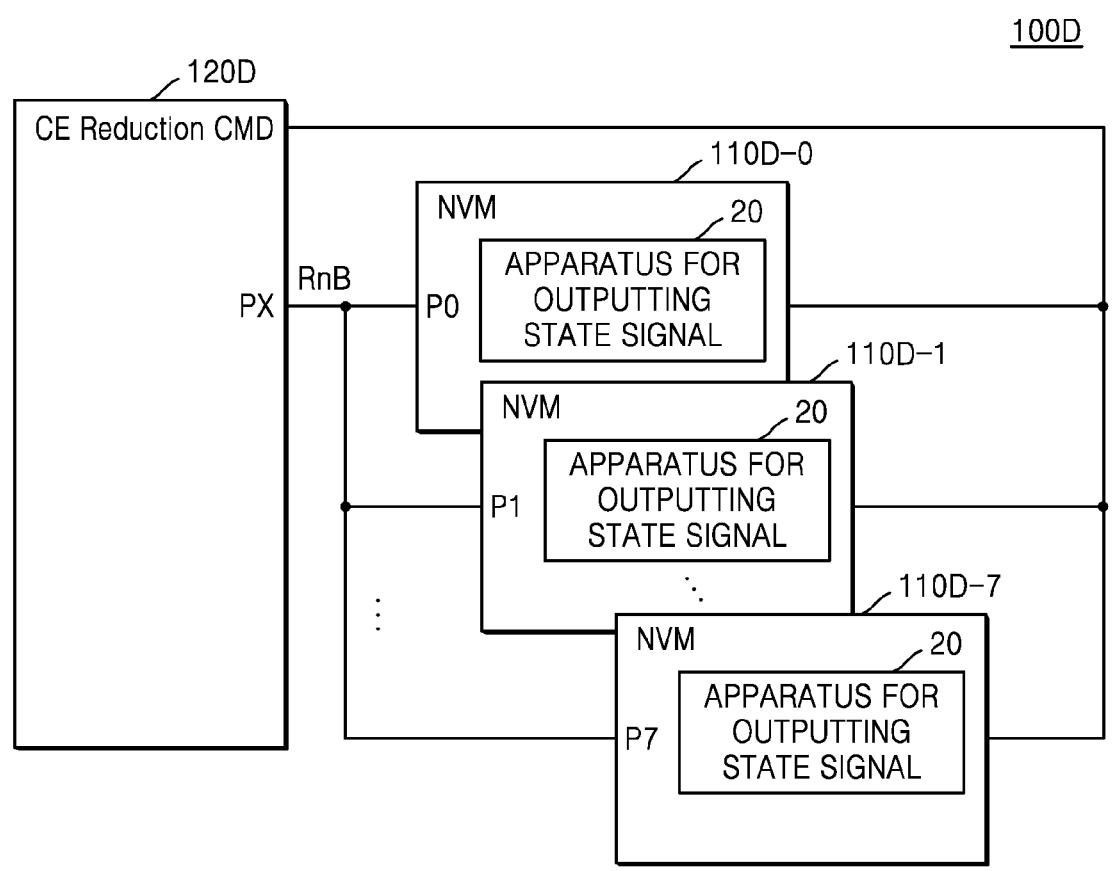
FIG. 7 is a diagram illustrating a configuration of a memory system to which a method of outputting a state signal is applied according to another exemplary embodiment.

FIG. 7 is a diagram illustrating a configuration of a memory system 100D to which a method of outputting a state signal is applied according to another exemplary embodiment.

As shown in FIG. 7, the memory system 100D includes a plurality of memory apparatuses 110D-0 through 110D-7 and a memory controller 120D.

For example, eight memory apparatuses 110D-0 through 110D-7 constitute one channel in FIG. 7. That is, in the memory system 100D of FIG. 7, one channel is comprised of eight ways. However, the inventive concept is not limited thereto, and at least one channel may be comprised of a plurality of ways.

The memory apparatuses 110D-0 through 110D-7 may be non-volatile memory devices. Examples of the memory apparatuses 110D-0 through 110D-7 may include flash memory devices, PRAMs, FRAMs, and MRAMs. The memory apparatuses 110D-0 through 110D-7 may be formed by combining at least one non-volatile memory device with at least one volatile memory device, or may be formed by combining at least two types of non-volatile memory devices.

Like the memory apparatuses 110C-0 through 110C-7 of FIG. 6, the memory apparatuses 110D-0 through 110D-7 of FIG. 7 may include a single die or a plurality of dies, and each of the dies may include a single plane or a plurality of planes. One plane includes a plurality of memory blocks, each of the memory blocks includes a plurality of pages, and each of the pages includes a plurality of sectors.

Each of the memory apparatuses 110D-0 through 110D-7 includes the apparatus 20. The state output pins P0 through P7 for outputting signals indicating internal states are arranged in the memory apparatuses 110D-0 through 110D-7, respectively. For example, each of the state output pins P0 through P7 may be allocated to an RnB pin indicating a ready/busy state.

The apparatus 20 has been described with reference to FIG. 6, and thus a detailed explanation thereof will not be given.

The memory controller 120D generates a CE reduction command that is an initially set function command and transmits the CE reduction command to the memory apparatuses 110D-0 through 110D-7. The CE reduction command is a function command for setting a chip enable timing of each of the memory apparatuses 110D-0 through 110D-7. That is, a chip enable signal of each of the memory apparatuses 110D-0 through 110D-7 according to ways may be generated according to the CE reduction command.

The state output pins P0 through P7 of the memory apparatuses 110D-0 through 110D-7 are connected to the single RnB pin PX arranged in the memory controller 120D in a wired-AND configuration. Accordingly, the memory controller 120D may individually check an internal state of each of the memory apparatuses 110D-0 through 110D-7 through the RnB pin PX. In detail, the memory controller 120D may individually check an internal state of each of the memory apparatuses 110D-0 through 110D-7 in association with a logic state of a chip enable signal according to the CE reduction command.

The memory system 100C or 100D of FIG. 6 or 7 checks an internal state according to each memory chip. Alternatively, when state output pins are additionally arranged according to dies or planes of the memory apparatuses 110C-0 through 110C-7 or 110D-0 through 110D-7 in the memory system 100C or 100D of FIG. 6 or 7, and RnB pins PX are additionally arranged in units of the dies or planes in the memory controller 120C or 120D, an internal state may be checked according to each die or plane. In other words, a state output pin may be arranged for each die or for each plane of a particular memory apparatus. Examples of this configuration will be described in more detail below.

Figure 8A:
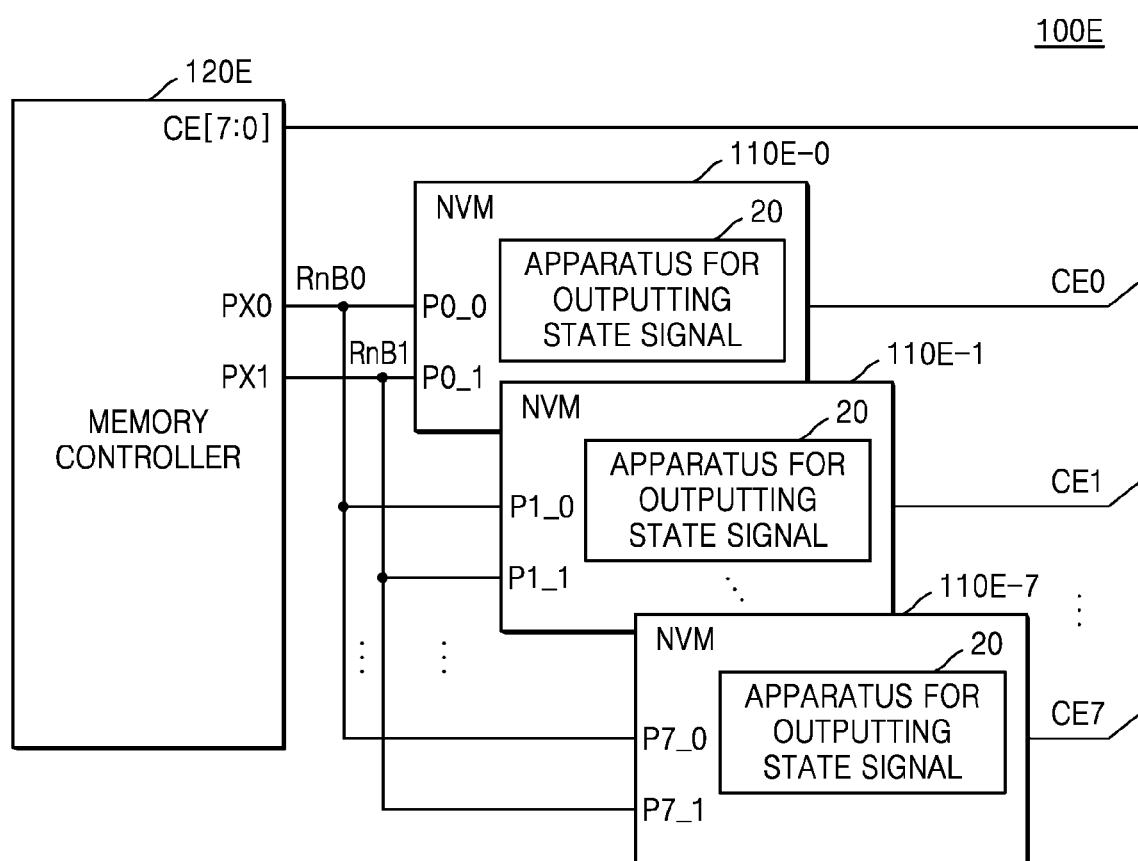
FIGS. 8A and 8B are diagrams illustrating a configuration of a memory system to which a method of outputting a state signal is applied according to other exemplary embodiments.
Figure 8B:
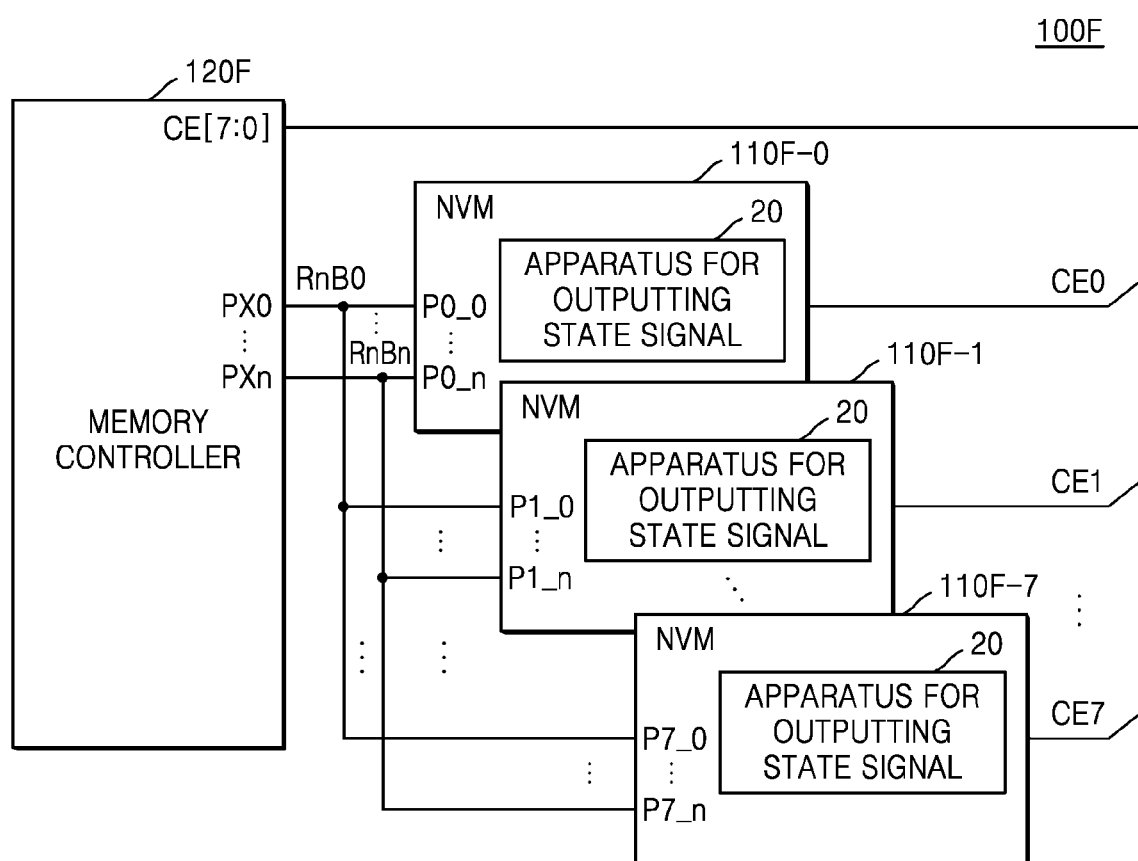

FIGS. 8A and 8B are diagrams illustrating a configuration of a memory system 100E to which a method of outputting a state signal is applied according to other exemplary embodiments.

As shown in FIG. 8A, a memory system 100E includes a plurality of memory apparatuses 110E-0 through 110E-7 and a memory controller 120E. However, unlike the memory controller 120C of FIG. 6, the memory controller 120E includes a first RnB pin PX0 and a second RnB pin PX1. Also, unlike in the memory apparatuses 110C-0 through 110C-7 of FIG. 6, first state output pins P0_0 through P7_0 and second state output pins P0_1 through P7_1 for outputting signals indicating internal states may be arranged in the memory apparatuses 110E-0 through 110E-7.

For example, the memory apparatuses 110E-0 through 110E-7 may output signals indicating first states of the memory apparatuses 110E-0 through 110E-7 through the first state output pins P0_0 through P7_0, and the memory apparatuses 110E-0 through 110E-7 may output signals indicating second states of the memory apparatuses 110E-0 through 110E-7 through the second state output pins P0_1 through P7_1. For example, the first state may be a PASS/FAIL state indicating whether a read operation passes or fails, and the second state may be a PASS/FAIL state indicating whether a program operation passes or fails. However, the inventive concept is not limited thereto, and the first state and the second state may be any one of various internal states of each of the memory apparatuses 110E-0 through 110E-7. As another example, the first state may be the state of a first die or plane in the memory apparatus, and the second state may be the state of a second die or plane in the memory apparatus.

The memory controller 120E may determine two types of internal states (e.g., whether a read operation passes or fails and whether a program operation passes or fails) of each of the memory apparatuses 110E-0 through 110E-7 through the first RnB pin PX0 and the second RnB pin PX1 by using one chip enable signal CE, which will be explained below in detail.

As shown in FIG. 8B, a memory system 100F includes a plurality of memory apparatuses 110E-0 through 110E-7 and a memory controller 120F. However, unlike the memory controller 120C of FIG. 6, the memory controller 120F may include a plurality of RnB pins PX0 through PXn. Also, unlike in the memory apparatuses 110C-0 through 110C-7 of FIG. 6, first state output pins P0_0 through P7_0 through $n^{th}$ state output pins P0_$n$ through P7_$n$ for outputting signals indicating internal states may be arranged in the memory apparatuses 110E-0 through 110E-7. For example, the memory apparatuses 110E-0 through 110E-7 may output signals indicating first states of the memory apparatuses 110E-0 through 110E-7 through the first state output pins P0_0 through P7_0, and may output signals indicating $n^{th}$ states of the memory apparatuses 110E-0 through 110E-7 through the $n^{th}$ state output pins P0_$n$ through P7_$n$. As such, the memory controller 120F may receive signals indicating the first through $n^{th}$ states from the memory apparatuses 110E-0 through 110E-7 through first through n$^{th}$ RnB pins PX0 through PXn. As another example, the first through n$^{th}$ states may correspond to the states of different dies or planes in the memory apparatuses.

The memory controller 120F may determine a plurality of internal states of the memory apparatuses 110E-0 through 110E-7 through the first through n$^{th}$ RnB pins PX0 through PXn by using one chip enable signal CE.

Figure 9:
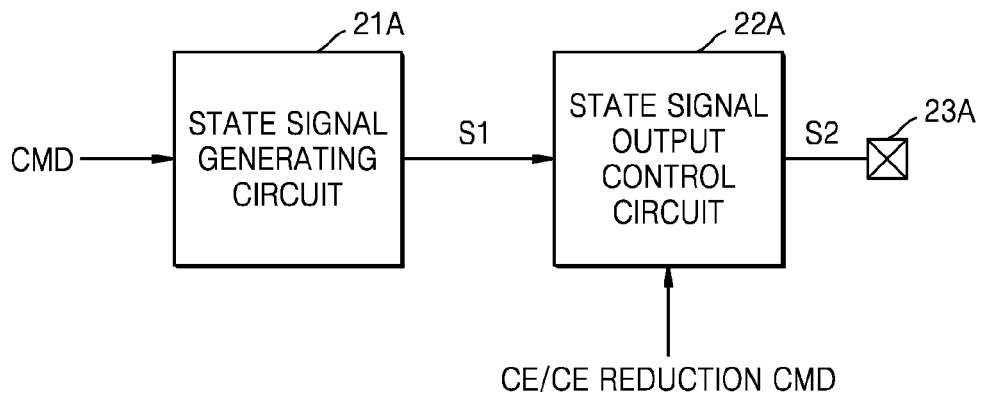
FIG. 9 is a diagram illustrating a configuration of a modification of an apparatus for outputting a state signal of FIG. 6 or 7.

FIG. 9 is a diagram illustrating a configuration of a modification of the apparatus 20 of FIG. 6 or 7.

As shown in FIG. 9, an apparatus 20A for outputting a state signal includes a state signal generating circuit 21A, a state signal output control circuit 22A, and an output pad 23A.

The state signal generating circuit 21A generates a first signal S1 by dividing an internal operation state of a memory apparatus into two states.

For example, the state signal generating circuit 21A may generate the first signal S1 having a first logic state indicating a busy state in which an operation is being performed according to a received command CMD or may generate the first signal S1 having a second logic state indicating a ready state in which the operation is completed according to the received command CMD.

Alternatively, the state signal generating circuit 21A may generate the first signal S1 indicating a state related to at least one operation from among a read operation, a program operation, and an erase operation performed according to the received command CMD. For example, a PASS/FAIL state signal indicating whether at least one of a read operation, a program operation, and an erase operation passes or fails may be generated as the first signal S1.

The state signal output control circuit 22A receives the first signal S1 and outputs a second signal S2 that is divided into three states to the output pad 23A based on at least one of a chip enable signal CE and a CE reduction command.

For example, the state signal output control circuit 22A outputs the second signal S2 having a logic state associated with a logic state of the first signal S1 to the output pad 23A in a chip enable interval according to the chip enable signal CE and the CE reduction command, or both the chip enable signal CE and the CE reduction command. The output pad 23A has a high impedance state irrespective of the logic state of the first signal S1 in a chip disable interval.

Figure 10:
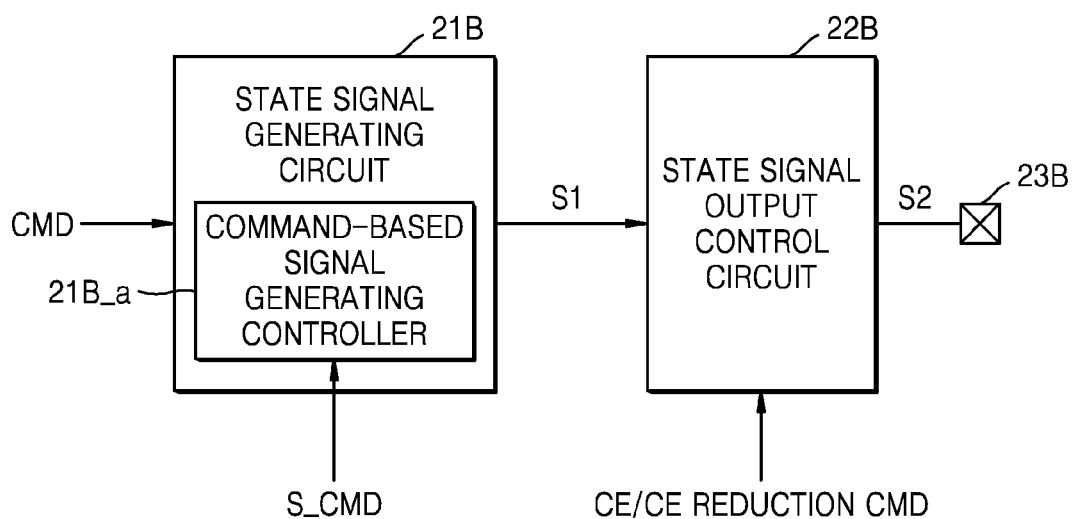
FIG. 10 is a diagram illustrating a configuration of another modification of the apparatus for outputting a state signal of FIG. 6 or 7.

FIG. 10 is a diagram illustrating a configuration of another modification of the apparatus 20 of FIG. 6 or 7.

As shown in FIG. 10, unlike in the apparatus 20A of FIG. 9, a state signal generating circuit 21B may further include a command-based signal generating controller 21B_a. In an exemplary embodiment, the command-based signal generating control unit 21B_a may receive a setting command S_CMD, and may select the first signal S1 related to which internal state from among a plurality of internal states of a memory apparatus as a signal to be generated when the state signal generating circuit 210B receives a command CMD based on the setting command S_CMD.

For example, the command-based signal generating controller 21B_a may control the state signal generating circuit 21B to generate the first signal S1 indicating a PASS/FAIL state of a read operation when the command CMD is a read command, based on the setting command S_CMD, and may control the state signal generating circuit 21B to generate the first signal S1 indicating a PASS/FAIL state of a program operation when the command CMD is a program command, based on the setting command S_CMD. Alternatively, the command-based signal generating controller 21B_a may control the state signal generating circuit 21B to generate the first signal S1 indicating a busy or ready state of the memory apparatus irrespective of a type of the command CMD, based on the setting command S_CMD.

Figure 11:
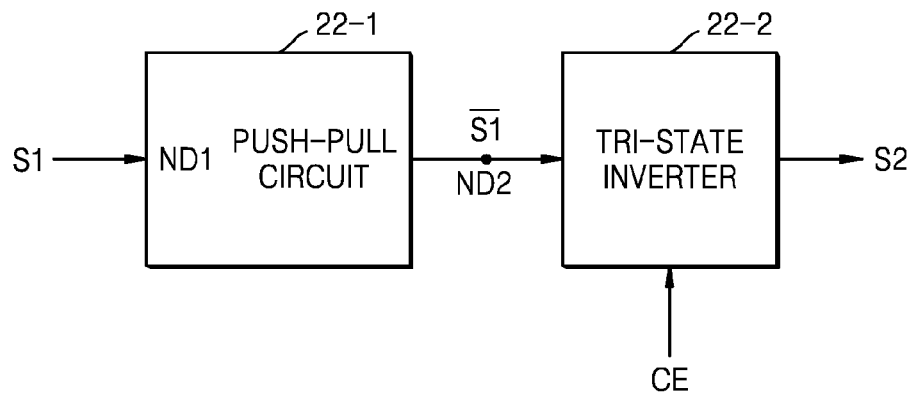
FIG. 11 is a diagram illustrating a configuration of a state signal output control circuit of FIG. 9 according to an exemplary embodiment.

FIG. 11 is a diagram illustrating a configuration of the state signal output control circuit 22A of FIG. 9 according to an exemplary embodiment.

As shown in FIG. 11, the state signal output control circuit 22A includes a push-pull circuit 22-1 and a tri-state inverter 22-2.

The push-pull circuit 22-1 receives a first signal S1 through a first node ND1 and outputs an inverted first signal /S1 to a second node ND2.

The tri-state inverter 22-2 receives a signal of the second node ND2, and inverts the signal of the second node ND2 and outputs the inverted signal to the output pad 23A when the chip enable signal CE is in a first logic state. The tri-state inverter 22-2 operates so that the output pad 23 has a high impedance state when the chip enable signal CE is in a second logic state. That is, the output pad 23 has a high impedance state irrespective of a logic state of the signal of the second node ND2 when the chip enable signal CE is in the second logic state. Accordingly, a state of the second signal S2 detected by the output pad 23 may be divided into three states 0, 1, and Hi-Z (high impedance).

Figure 12:
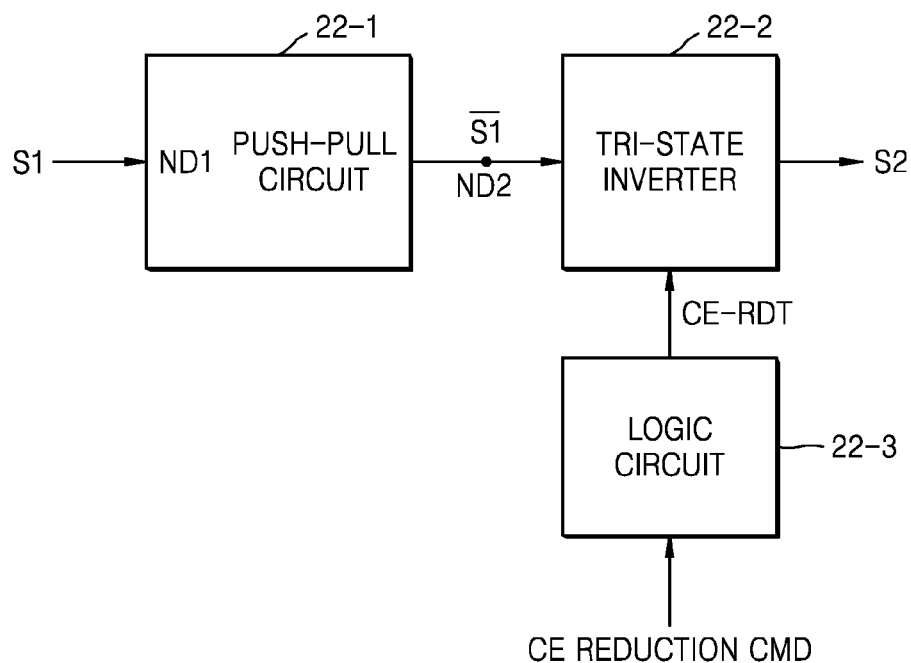
FIG. 12 is a diagram illustrating a configuration of a modification of the state signal output control circuit of FIG. 9.

FIG. 12 is a diagram illustrating a configuration of a modification of the state signal output control circuit 22A of FIG. 9.

As shown in FIG. 12, the state signal output control circuit 22B includes the push-pull circuit 22-1, the tri-state inverter 22-2, and a logic circuit 22-3.

The push-pull circuit 22-1 and the tri-state inverter 22-2 have already described with reference to FIG. 11, and thus a repeated explanation thereof will not be given.

The logic circuit 22-3 generates a chip enable signal CE_RDT for a way to which a memory apparatus belongs from a CE reduction command. The chip enable signal CE_RDT generated by the logic circuit 22-3 has a logic state waveform that is substantially the same as that of the chip enable signal CE applied to the tri-state inverter 22-2 of FIG. 11.

Accordingly, the second signal S2 output from the tri-state inverter 22-2 of FIG. 12 to the output pad 23 and the second signal S2 output from the tri-state inverter 22-2 of FIG. 11 to the output pad 23 have the same state waveform.

Figure 13A:
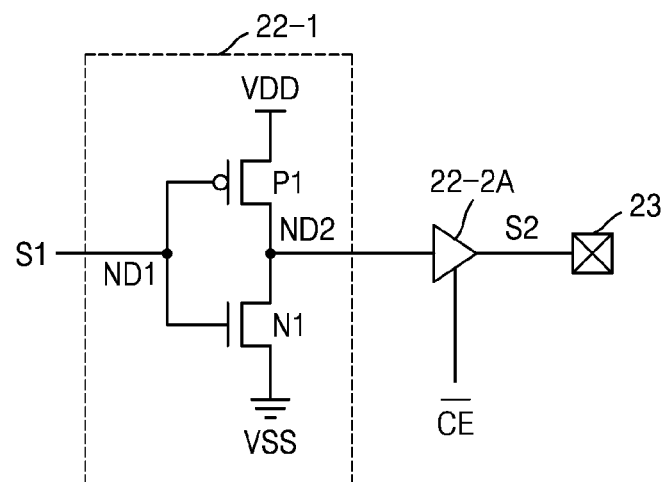
FIG. 13A is a detailed circuit diagram illustrating configurations of a push-pull circuit and a tri-state inverter of the state signal output control circuit of FIG. 11 or 12 according to an exemplary embodiment.

FIG. 13A is a detailed diagram illustrating configurations of the push-pull circuit 22-1 and the tri-state inverter 22-2 of FIG. 11 or 12 according to an exemplary embodiment.

The push-pull circuit 22-1 may include two transistors. For example, the push-pull circuit 22-1 may include one p-channel metal-oxide-semiconductor (PMOS) transistor P1 and one n-channel metal-oxide-semiconductor (NMOS) transistor N1. In detail, the PMOS transistor P1 has a gate connected to the first node ND1, a source connected to a power supply terminal VDD, and a drain connected to the second node ND2. The NMOS transistor N1 has a gate connected to the first node ND1, a source connected to a ground terminal VSS, and a drain connected to the second node ND2.

The PMOS transistor P1 is turned on and the NMOS transistor N1 is turned off in an interval where the first signal S1 input to the first node ND1 is in a LOW logic state. Accordingly, a signal having a HIGH state is output to the second node ND2.

The PMOS transistor P1 is turned off and the NMOS transistor N1 is turned on in an interval where the first signal S1 input to the first node ND1 is in a HIGH logic state. Accordingly, a signal having a LOW state is output to the second node ND2.

Accordingly, the push-pull circuit 22-1 inverts the first signal S1 input to the first node ND1 and outputs the inverted first signal to the second node ND2.

A tri-state inverter 22-2A inverts a signal of the second node ND2 and outputs the inverted signal to the output pad 23 when an inverted chip enable signal/CE is in a logic HIGH state. The tri-state inverter 22-2A changes to a high impedance state when the inverted chip enable signal/CE is in a logic LOW state.

Accordingly, the second signal S2 having the same logic state as that of the first signal S1 is output to the output pad 23 in an interval where the inverted chip enable signal/CE is in a logic HIGH state. The output pad 23 has a high impedance state irrespective of a logic state of the first signal S1 in an interval where the inverted chip enable signal/CE is in a logic LOW state.

Figure 13B:
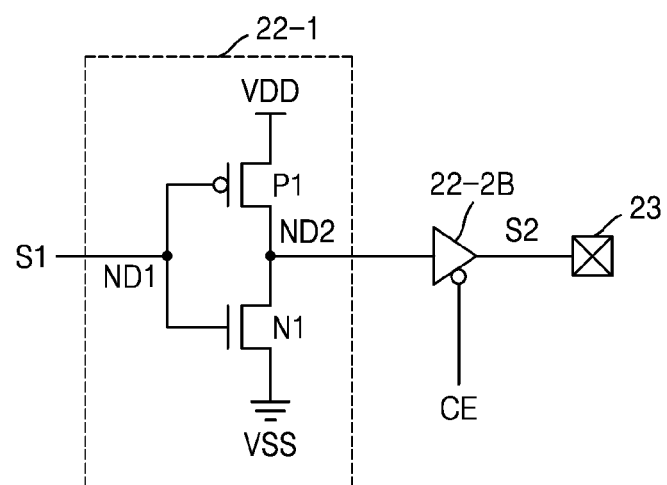
FIG. 13B is a detailed circuit diagram illustrating configurations of the push-pull circuit and the tri-state inverter of the state signal output control circuit of FIG. 11 or 12 according to another exemplary embodiment.

FIG. 13B is a detailed diagram illustrating configurations of the push-pull circuit 22-1 and the tri-state inverter 22-2 of FIG. 11 or 12 according to another exemplary embodiment.

The push-pull circuit 22-1 is the same as the push-pull circuit 22-1 of FIG. 13A, and thus a repeated explanation thereof will not be given.

That is, a tri-state inverter 22-2B inverts a signal of the second node ND2 and outputs the inverted signal to the output pad 23 when the chip enable signal CE is in a logic LOW state. The tri-state inverter 22-2B changes to a high impedance state when the chip enable signal CE is in a logic HIGH state.

Accordingly, the second signal S2 having the same logic state as that of the first signal S1 is output to the output pad 23 in an interval where the chip enable signal CE is in a logic LOW state. The output pad 23 has a high impedance state irrespective of a logic state of the first signal S1 in an interval where the chip enable signal CE is in a logic HIGH state.

For example, in FIGS. 13A and 13B, the tri-state inverter 22-2A or 22-2B is configured so that the chip enable signal CE is set to active low. Alternatively, the tri-state inverter 22-2A or 22-2B may be configured so that the chip enable signal CE is set to active high.

Figure 14:
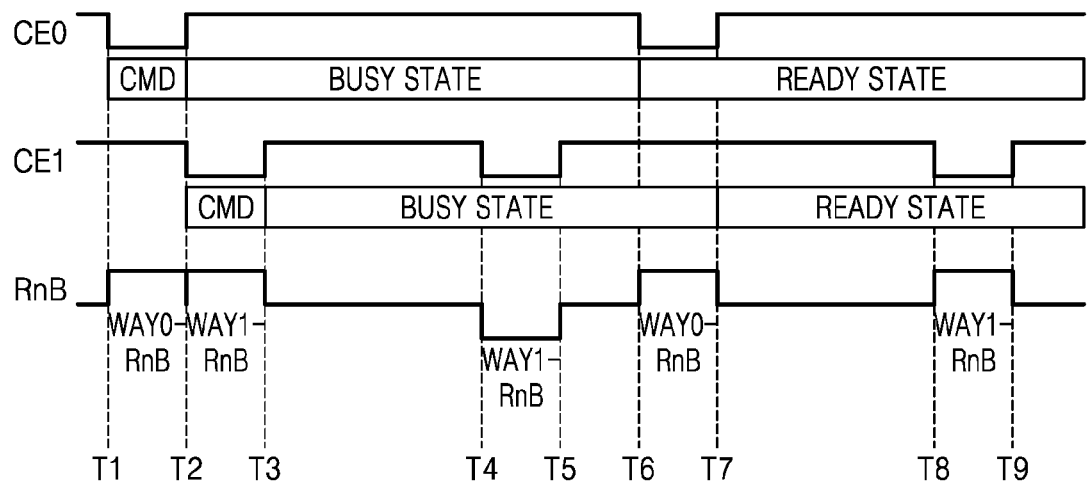
FIG. 14 is a diagram illustrating waveforms of signals for explaining an operation of determining an internal state of each of memory apparatuses in multi-ways of the memory system of FIG. 6 or 7.

FIG. 14 is a diagram illustrating waveforms of signals for explaining an operation of determining an internal state of each of memory apparatuses in multi-ways of the memory system 100C or 100D of FIG. 6 or 7. For reference, for convenience of explanation, FIG. 14 illustrates ready/busy signals RnB of the memory apparatus 110C-0 or 110D-0 of the way 0 and the memory apparatus 110C-1 or 110D-1 of the way 1. However, it will be understood that the remaining ways 2-7 operate in a similar manner. For example, a chip enable signal is set to active low in FIG. 14.

Referring to FIG. 14, a chip enable signal CE0 of the way 0 is in a LOW state in an interval from T1 to T2. The way 0 is chip-enabled in an interval where the chip enable signal CE0 is in a LOW state.

When a ready/busy signal WAY0-RnB indicating an internal state of the memory apparatus 110C-0 or 110D-0 of the way 0 in the interval from T1 to T2 is in a ready state HIGH, the ready/busy signal RnB having a high state is transmitted to the RnB pin PX of the memory controller 120C or 120D. Accordingly, a command CMD may be transmitted to the way 0 in the interval from T1 to T2.

A chip enable signal CE1 of the way 1 is in a LOW state in an interval from T2 to T3. The way 1 is chip-enabled in an interval where the chip enable signal CE1 is in a LOW state.

When a ready/busy signal WAY1-RnB indicating an internal state of the memory apparatus 110C-1 or 110D-1 of the way 1 in the interval from T2 to T3 is in a ready state HIGH, the ready/busy signal RnB having a high state is transmitted to the RnB pin PX of the memory controller 120C or 120D. Accordingly, a command CMD may be transmitted to the way 1 in the interval from T2 to T3.

It is assumed that the memory apparatus 110C-0 or 110D-0 of the way 0 is in a busy state in an interval from T2 to T6 and then changes to a ready state after T6 as the transmitted command CMD is executed. It is assumed that the memory apparatus 110C-1 or 110D-1 of the way 1 is in a busy state in an interval from T3 to T7 and then changes to a ready state after T7 as the transmitted command CMD is executed.

As shown in FIG. 13A or 13B, in an interval where the chip enable signal CE0 or CE1 of at least one way from among ways constituting one channel is in a LOW state, a ready/busy signal RnB having a high state or a low state is transmitted according to an internal state of each of the ways to the RnB pin PX of the memory controller 120C or 120D. In an interval where the chip enable signals CE0 and CE1 of all of the ways constituting the one channel are in a HIGH state, the RnB pin PX of the memory controller 120C or 120D has a high impedance state HIGH-Z.

Accordingly, the RnB pin PX of the memory controller 120C or 120D has a high impedance state HIGH-Z in intervals after T3-T4, T5-T6, T7-T8, and T9.

Since the chip enable signal CE1 of the way 1 is in a LOW state in an interval from T4 to T5, a ready/busy signal WAY1-RnB indicating an internal state of the memory apparatus 110C-1 or 110D-1 of the way 1 is transmitted to the RnB pin PX. Accordingly, since an internal state of the memory apparatus 110C-1 or 110D-1 of the way 1 in the interval from T4 to T5 is a busy state, the RnB signal having a low state indicating the busy state is transmitted to the RnB pin PX.

Since the chip enable signal CE0 of the way 0 is in a LOW state in an interval from T6 to T7, a ready/busy signal WAY0-RnB indicating an internal state of the memory apparatus 110C-0 or 110D-0 of the way 0 is transmitted to the RnB pin PX. Accordingly, since an internal state of the memory apparatus 110C-0 or 110D-0 of the way 0 in the interval from T6 to T7 is a ready state, the RnB signal having a high state indicating the ready state is transmitted to the RnB pin PX.

Since the chip enable signal CE1 of the way 1 is in a LOW state in an interval from T8 to T9, a ready/busy signal WAY1-RnB indicating an internal state of the memory apparatus 110C-1 or 110D-1 of the way 1 is transmitted to the RnB pin PX. Accordingly, since an internal state of the memory apparatus 110C-1 or 110D-1 of the way 1 in the interval from T8 to T9 is a ready state, the RnB signal having a high state indicating the ready state is transmitted to the RnB pin PX.

Accordingly, the memory controller 120C or 120D may check an internal state of each of the ways based on a state of a chip enable signal of multi-ways and a state of an RnB signal transmitted to the single RnB pin PX.

Figure 15:
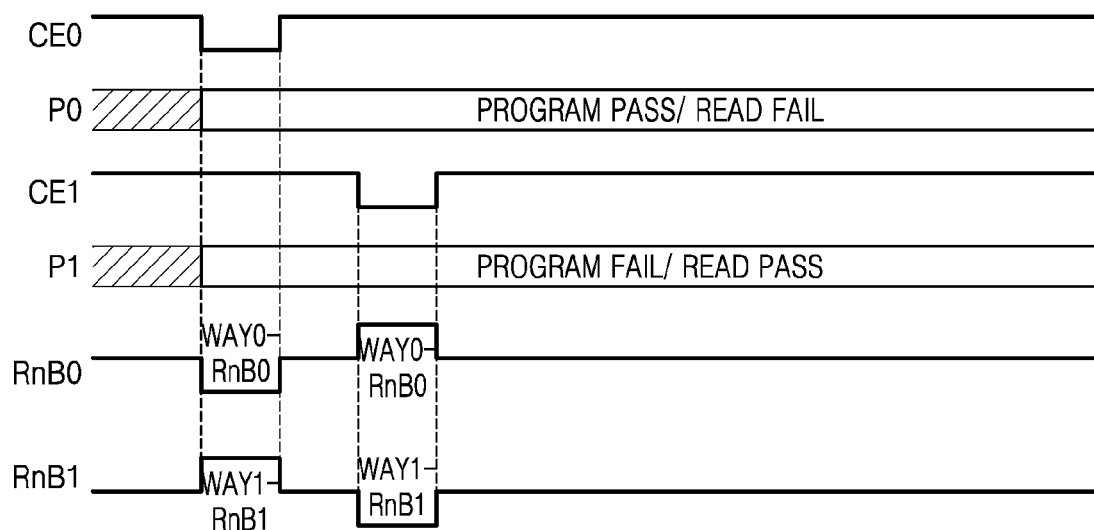
FIG. 15 is a diagram illustrating waveforms of signals for explaining an operation of determining an internal state of each of memory apparatuses in multi-ways of the memory system of FIG. 8A.

FIG. 15 is a diagram illustrating waveforms of signals for explaining an operation of determining an internal state of each of memory apparatuses in multi-ways of the memory system 100E of FIG. 8A.

Referring to FIGS. 8A and 15, after a program operation and a read operation are performed according to a predetermined command, the first memory apparatus 110E-0 may be in a state where the program operation passes and the read operation fails and the second memory apparatus 110E-1 may be in a state where the program operation fails and the read operation passes. However, when the first memory apparatus 110E-0 receives a chip enable signal CE0, the first memory apparatus 110E-0 may output a WAY0-RnB0 signal having a logic low state indicating that the program operation of the first memory apparatus 110E-0 fails to a first RnB pin PX0, and may also output a WAY1-RnB1 signal having a logic high state indicating that the read operation passes to a second RnB pin PX1. Next, when the second memory apparatus 110E-1 receives a chip enable signal CE1, the second memory apparatus 110E-1 may output a WAY0-RnB0 signal having a logic high state indicating that the program operation of the second memory apparatus 110E-1 passes to the first RnB pin PX0, and may also output a WAY1-RnB1 signal having a logic low state indicating that the read operation fails to the second RnB pin PX1. Accordingly, the memory controller 120E may determine that the program operation and the read operation of the first memory apparatus 110E-0 respectively pass and fail by using one chip enable signal CE0. Also, the memory controller 120E may determine that the program operation and the read operation of the second memory apparatus 110E-1 respectively fail and pass by using one chip enable signal CE1.

As such, the memory controller 120E may receive two or more types of internal state signals of the memory apparatus 110E-0 through a plurality of RnB pins (e.g., PX0 and PX1) by transmitting one chip enable signal CE0 to the memory apparatus 110E-0. Accordingly, a time taken to determine various internal states of each of the memory apparatuses 110E-0 through 110E-7 may be reduced, thereby improving the overall performance of the memory system 100E.

Figure 16:
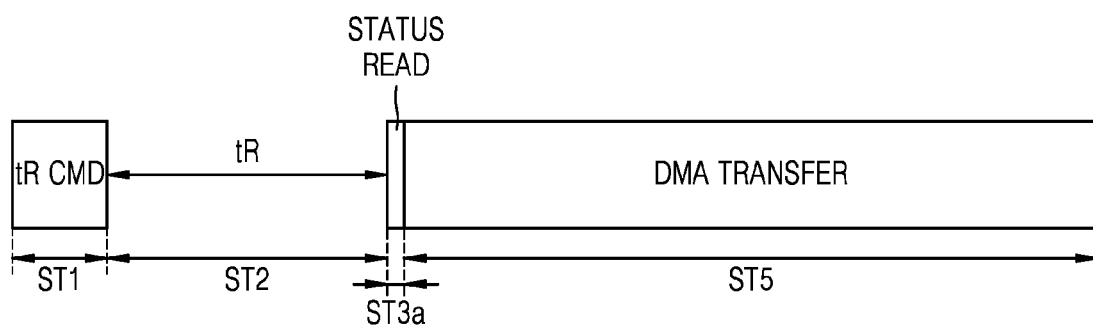
FIG. 16 is a timing diagram for explaining an operation of determining an internal state of each of memory apparatuses in multi-ways of the memory system of FIG. 6 or 7.

FIG. 16 is a timing diagram for explaining an operation of determining an internal state of each of memory apparatuses in multi-ways of the memory system 100C or 100D of FIG. 6 or 7.

Referring to FIG. 16, any one memory apparatus from among memory apparatuses in multi-ways receives a read command during an interval ST1 and performs a data read operation according to the read command during an interval ST2. A memory controller checks an internal state of each of the memory apparatuses by using a chip enable signal CE or a CE reduction command during an interval ST3$a$. Next, data read from the memory apparatus is transmitted to the memory controller according to a DMA operation during an interval ST5.

Unlike an operation for determining an internal state of each of memory apparatuses in multi-ways using a state read command of FIG. 4, an operation of FIG. 16 does not require a random out command CMD, and thus an interval ST4 where the random out command CMD is transmitted may be omitted. Also, in the operation of FIG. 16, since a command overhead according to the use of the state read command is not required, a length of the interval ST3$a$ where an internal state of each of the memory apparatuses in the multi-ways is checked is reduced to be less than that of the interval ST3 of FIG. 4.

Figure 17:
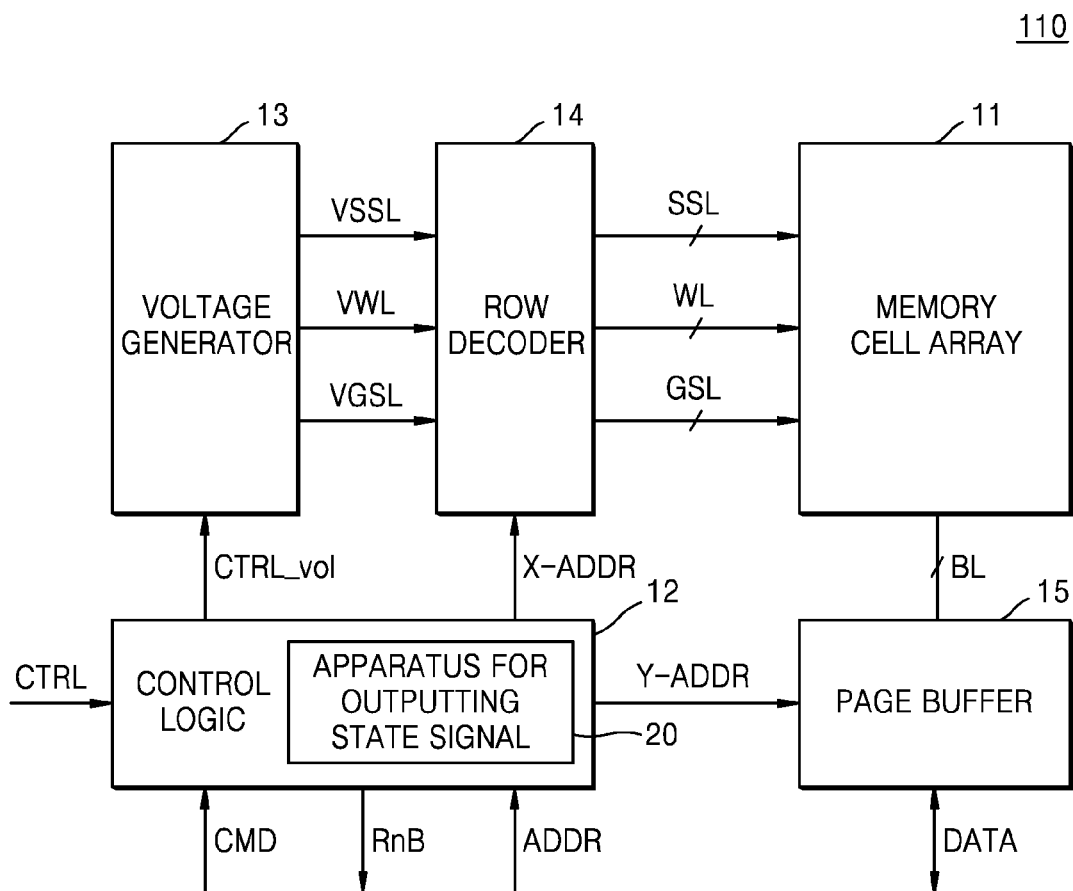
FIG. 17 is a diagram illustrating a configuration of a memory apparatus of the memory system of FIG. 6 or 7 according to an exemplary embodiment.

FIG. 17 is a diagram illustrating a configuration of a memory apparatus 110 of the memory system 110C or 110D of FIG. 6 or 7 according to an exemplary embodiment.

Referring to FIG. 17, the memory apparatus 110 may include a memory cell array 11, a control logic 12, a voltage generator 13, a row decoder 14, and a page buffer 15.

The memory cell array 11 may include a plurality of memory cells arranged at intersections between a plurality of word lines and a plurality of bit lines. In an exemplary embodiment, the plurality of memory cells may be flash memory cells. For example, the memory cell array 11 may be a NAND flash memory cell array or a NOR flash memory cell array. Embodiments will now be explained in detail on the assumption that the plurality of memory cells are NAND flash memory cells.

The memory cell array 11 has a string structure in which a plurality of memory cells are serially connected. For example, in each cell string, a ground selection transistor between a common source line CSL and a bit line BL, one or more memory cells, a plurality of main memory cells, and a string selection transistor are serially connected. A dummy memory cell may be located between the ground selection transistor and the plurality of main memory cells in order to reduce coupling effect on the main memory cells close to the common source line CSL. That is, the dummy memory cell may be located on an edge of the main memory cells. The main memory cells and the dummy memory cells connected to the plurality of bit lines BL are connected to different word lines. For example, the word lines connected to the dummy memory cells may be referred to as dummy word lines.

A program operation is sequentially performed beginning from a memory cell that is the closest to the ground selection transistor to which a global source line GSL is connected in the cell string in order to minimize back pattern dependency that is a weak point of the cell string structure. The global source line GSL may also be referred to as a ground selection line.

For example, the memory cell array 11 may be designed to have a two-dimensional (2D) planar NAND flash memory cell structure. Alternatively, the memory cell array 11 may be designed to have a three-dimensional (3D) vertical NAND flash memory cell structure.

In an exemplary embodiment, the memory cell array 11 having a 3D structure may be monolithically formed in one or more physical levels of arrays of memory cells having an active area located above a silicon substrate and circuitry associated with an operation of the memory cells and formed above or within the silicon substrate. The term "monolithic" means that layers of each level of the array are directly deposited on layers of each underlying level of the array.

In an exemplary embodiment, a 3D memory array includes vertical NAND strings that are vertically oriented so that at least one memory cell is located over another memory cell. The at least one memory cell may include a charge trap layer.

The following, patent documents, which are hereby incorporated by reference, describe suitable configurations of 3D memory arrays, in which a 3D memory array is configured as a plurality of levels and word lines and/or bit lines are shared between the levels: U.S. Pat. Nos. 7,679,133; 8,553,466; 8,654,587; 8,559,235; and U.S. Patent Publication No. 2011/0233648.

A plurality of memory cells MC have an erase state when an erase voltage is applied to the memory cell array 11 and have a program state when a program voltage is applied to the memory cell array 11. In this case, each of the memory cells MC may have any one from among an erase state and first through $n^{th}$ program states P1 through Pn divided according to a threshold voltage.

Here, n may be a natural number equal to or greater than 2. For example, when the memory cell MC is a 2-bit level cell, n may be 3. Alternatively, when the memory cell MC is a 3-bit level cell, n may be 7. Alternatively, when the memory cell MC is a 4-bit level cell, n may be 15. As such, the plurality of memory cells MC may include multi-level cells. However, the inventive concept is not limited thereto, and the plurality of memory cells MC may include single-level cells.

The control logic 12 may write data to the memory cell array 11 or may read data from the memory cell array 11 based on a command CMD, an address ADDR, and a control signal CTRL received from the memory controller 120A or 120B, or may output various control signals for erasing the memory cell array 11. Accordingly, the control logic 12 may control overall various operations in the memory apparatus 110.

Control signals generated by the control logic 12 may be applied to the voltage generator 13, the row decoder 14, and the page buffer 15. For example, the control logic 12 may apply a voltage control signal CTRL_vol to the voltage generator 13, may apply a row address X_ADDR to the row decoder 14, and may apply a column address Y_ADDR to the page buffer 15.

For example, the control logic 12 may include the apparatus 20 for outputting a state signal. Accordingly, the control logic 12 may divide a signal indicating an internal operation state into three states and output the divided signal to a state output pin (e.g., the RnB pin) based on at least one of a chip enable signal CE and/or an initially set function command (e.g., a CE reduction command) by using the apparatus 20. Alternatively, a circuit diagram of the apparatus 20 may be arranged in the memory apparatus 110 by being separated from the control logic 12.

The voltage generator 13 may generate various types of voltages for performing program, read, and erase operations on the memory cell array 11 based on the voltage control signal CTRL_vol. In detail, the voltage generator 13 may generate a first driving voltage VWL for driving a plurality of word lines WL, a second driving voltage VSSL for driving a plurality of string selection lines SSL, and a third driving voltage VGSL for driving a plurality of ground selection lines GSL.

In this case, the first driving voltage VWL may be a program voltage (or a write voltage), a read voltage, an erase voltage, a pass voltage, or a program verify voltage. Also, the second driving voltage VSSL may be a string selection voltage, that is, an on or off voltage. Furthermore, the third driving voltage VGSL may be a ground selection voltage, that is, an on or off voltage.

The row decoder 14 may be connected to the memory cell array 11 through the plurality of word lines WL, and may activate some word lines from among the plurality of word lines WL in response to the row address X_ADDR received from the control logic 12. In detail, during a read operation, the row decoder 14 may apply a read voltage to a selected word line and may apply a pass voltage to non-selected word lines.

During a program operation, the row decoder 14 may apply a program voltage to a selected word line and may apply a pass voltage to non-selected word lines.

During an erase operation, the row decoder 14 may apply an erase voltage (e.g., 0 V) to the word lines WL and may float the string selection line SSL and the ground selection line GSL.

The page buffer 15 may be connected to the memory cell array 11 through the plurality of bit lines BL. In detail, during a read operation, the page buffer 15 may act as a sense amplifier and may output data DATA stored in the memory cell array 11. During a program operation, the page buffer 15 may act as a write driver and may input data DATA to the memory cell array 11 and to be stored to the memory cell array 11.

Figure 18:
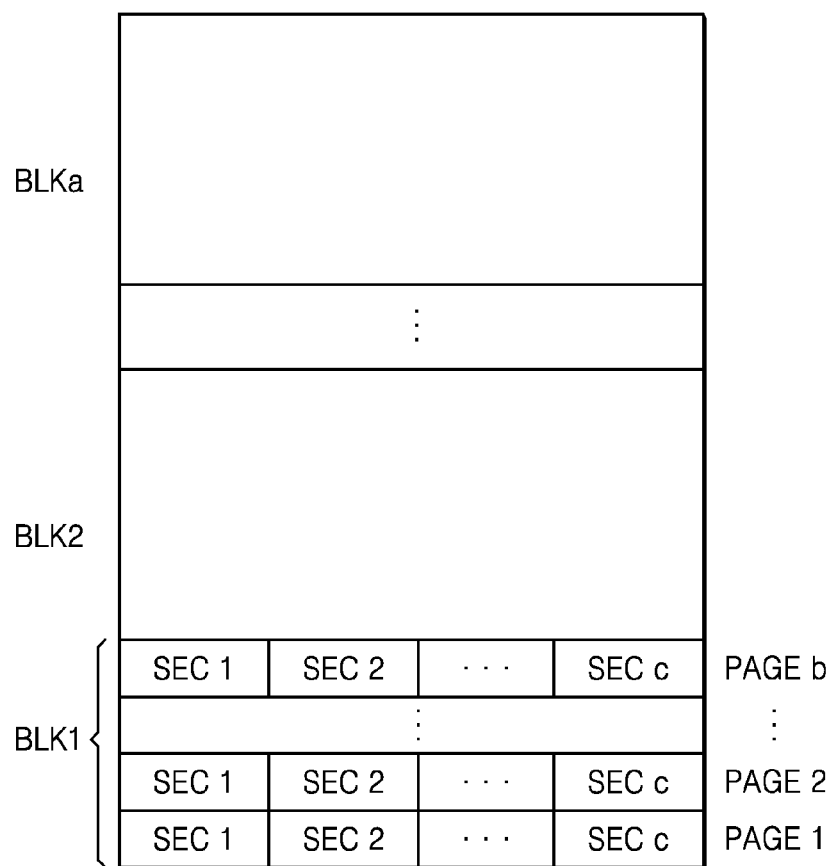
FIG. 18 is a diagram illustrating a memory cell array of the memory apparatus of FIG. 17 according to an exemplary embodiment.

FIG. 18 is a diagram illustrating the memory cell array 11 of FIG. 17 according to an exemplary embodiment.

Referring to FIG. 18, the memory cell array 11 may be a flash memory cell array. In this case, the memory cell array 11 may include a (a is an integer equal to or greater than 2) memory blocks, e.g., first through $a^{th}$ memory blocks BLK1 through BLKa, each of the first through $a^{th}$ memory blocks BLK1 through BLKa may include b (b is an integer equal to or greater than 2) pages PAGE1 through PAGEb, and each of the pages PAGE1 through PAGEb may include c (c is an integer equal to or greater than 2) sectors SEC1 through SECc. For convenience of explanation, although the pages PAGE0 through PAGEb and the sectors SEC1 through SECc only for the first memory block BLK1 are illustrated in FIG. 18, each of the other memory blocks BLK2 through BLKa may have the same structure as that of the first memory block BLK1.

Figure 19:
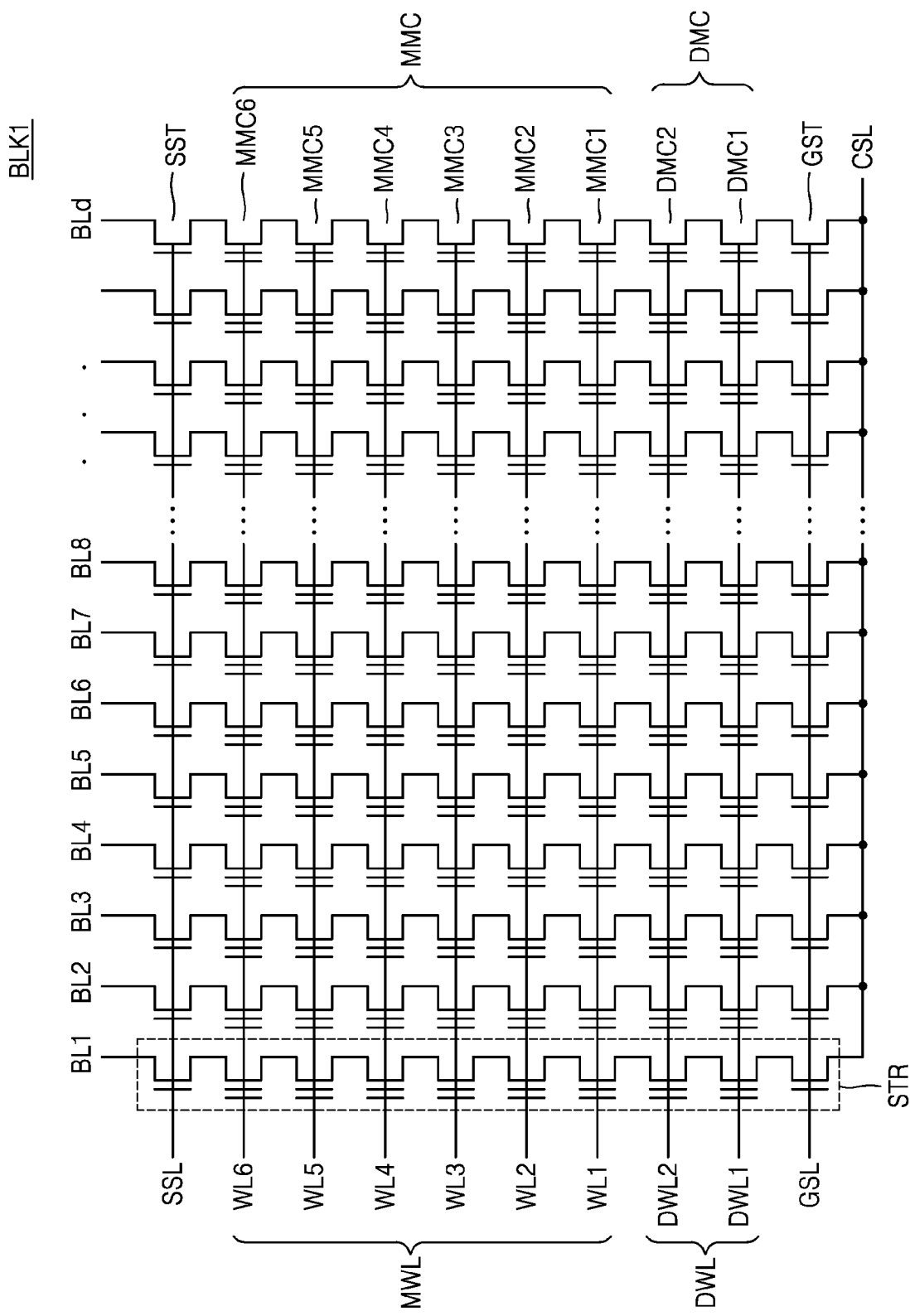
FIG. 19 is a circuit diagram illustrating a memory block included in the memory cell array of FIG. 18 according to an exemplary embodiment.

FIG. 19 is a circuit diagram illustrating the first memory block BLK1 included in the memory cell array 11 of FIG. 18 according to an exemplary embodiment.

Referring to FIG. 19, the first memory block BLK1 may be a horizontal NAND flash memory block, and each of the first through $a^{th}$ memory blocks BLK1 through BLKa of FIG. 18 may have the same structure as that in FIG. 19. The first memory block BLK1 may include, for example, d (d is an integer equal to or greater than 2) cell strings STR in each of which eight memory cells are serially connected. Each of the cell strings STR may include a string selection transistor SST and a ground selection transistor GST respectively connected to both ends of the memory cells that are serially connected. At least one memory cell adjacent to the ground selection transistor GST from among the eight memory cells included in one cell string may be set as a dummy memory cell.

In FIG. 19, two memory cells adjacent to the ground selection transistor GST are set as dummy memory cells DMC. Accordingly, six memory cells from among eight memory cells included in one cell string are set as main memory cells MMC. Alternatively, at least one dummy memory cell DMC may be added between the string selection transistor SST and the main memory cells MMC.

Dummy word lines DWL are connected to the dummy memory cells DMC and main word lines MWL are connected to the main memory cells MMC. As such, the dummy memory cells DMC are located between the ground selection transistor GST and the plurality of main memory cells, e.g., first through sixth main memory cells MMC1 through MMC6, in order to reduce coupling effect on main memory cells close to a common source line CSL. That is, at least one dummy memory cell is located on an edge of main memory cells.

The number of cell strings STR, the number of dummy word lines DWL, the number of main word lines MWL, and the number of bit lines BL may vary in various ways according to embodiments.

Alternatively, the dummy memory cells DMC may be omitted from each memory block and the memory block may include only the main memory cells MMC.

In a NAND flash memory apparatus having such a structure as in FIG. 19, an erase operation may be performed in units of memory blocks and a program operation may be performed in units of pages corresponding to each word line. For example, when a memory cell is a single-level cell, one page may correspond to one word line. Alternatively, when a memory cell is a multi-level cell or a triple-level cell, a plurality of pages may correspond to each word line.

Figure 20:
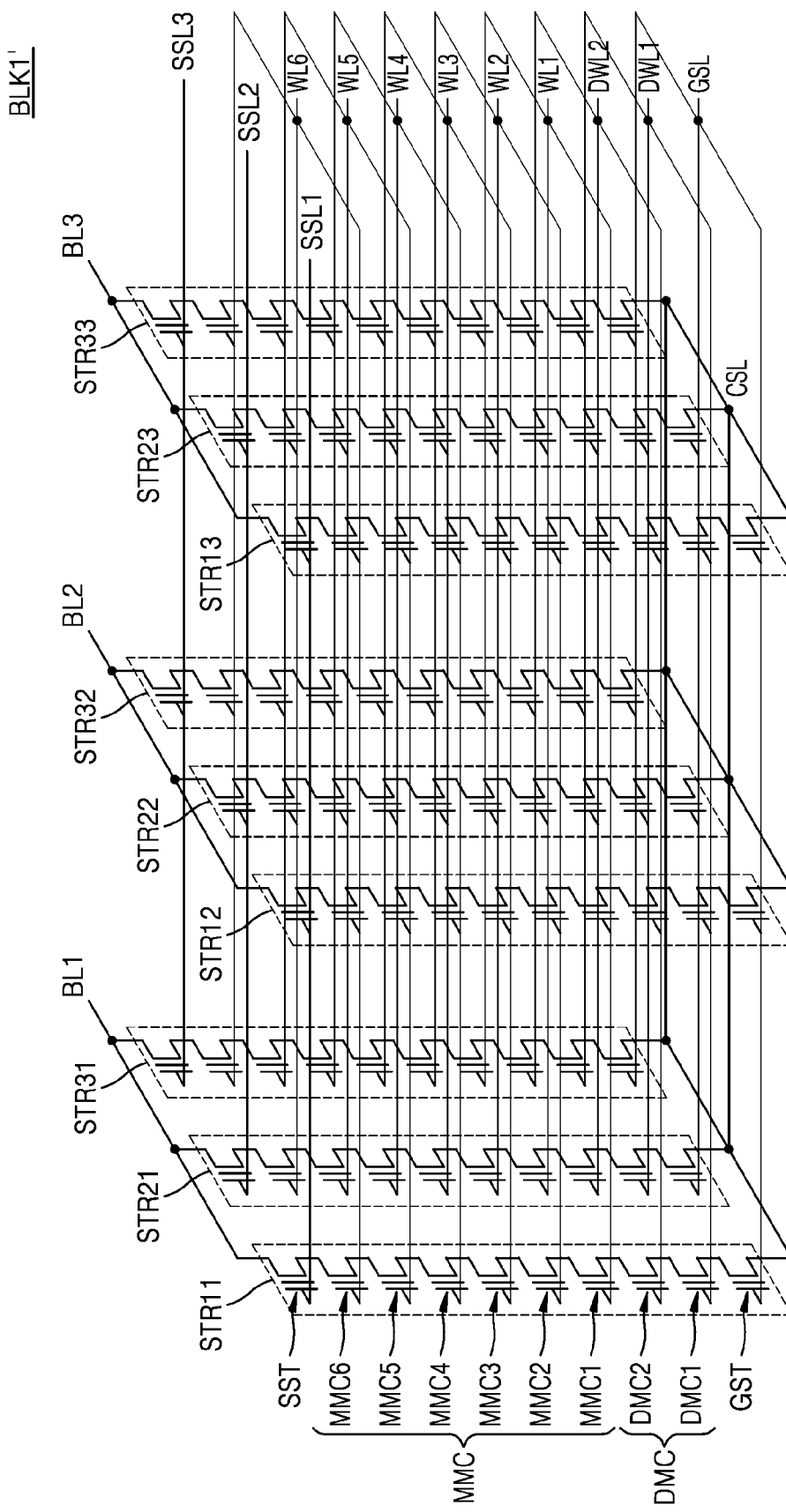
FIG. 20 is a circuit diagram illustrating a modification of the memory block included in the memory cell array of FIG. 18.

FIG. 20 is a circuit diagram illustrating a modification of the first memory block BLK1 included in the memory cell array 11 of FIG. 18.

A first memory block BLK1' may be a vertical NAND flash memory block, and each of the first through a' memory blocks BLK1 through BLKa of FIG. 18 may have the same structure as that in FIG. 20. The first memory block BLK1' may include a plurality of cell strings STR11 through STR33, a plurality of word lines DWL1, DWL2, and WL1 through WL6, a plurality of bit lines BL1 through BL3, a ground selection line GSL, a plurality of string selection lines SSL1 through SSL3, and a common source line CSL. The number of cell strings, the number of word lines, the number of bit lines, the number of ground selection lines, and the number of string selection lines may vary in various ways according to embodiments.

The cell strings STR11 through STR33 are connected between the bit lines BL1 through BL3 and the common source line CSL. Each of the cell strings, for example, the cell string STR11, may include a selection transistor SST, a plurality of memory cells DMC and MMC, and a ground selection transistor GST that are serially connected.

In FIG. 20, two memory cells adjacent to the ground selection transistor GST in a cell string are set as the dummy memory cells DMC. Accordingly, six memory cells from among eight memory cells included in one cell string are set as the main memory cells MMC. Alternatively, at least one dummy memory cell DMC may be added between the string selection transistor SST and the main memory cells MMC.

The string selection transistor SST is connected to the string selection lines SSL1 through SSL3. The plurality of memory cells MC1 through MC8 are respectively connected to the word lines WL1 through WL8. The ground selection transistor GST is connected to the ground selection line GSL. The string selection transistor SST is connected to the corresponding bit line BL, and the ground selection transistor GST is connected to the common source line CSL.

The word lines having the same height (e.g., WL1) are commonly connected to one another, and the string selection liens SSL1 through SSL3 are separated from one another. When memory cells connected to the word line WL1 and belonging to the cell strings STR11, STR12, and STR13 are programmed, the word line WL1 and the string selection line SSL1 are selected.

Figure 21:
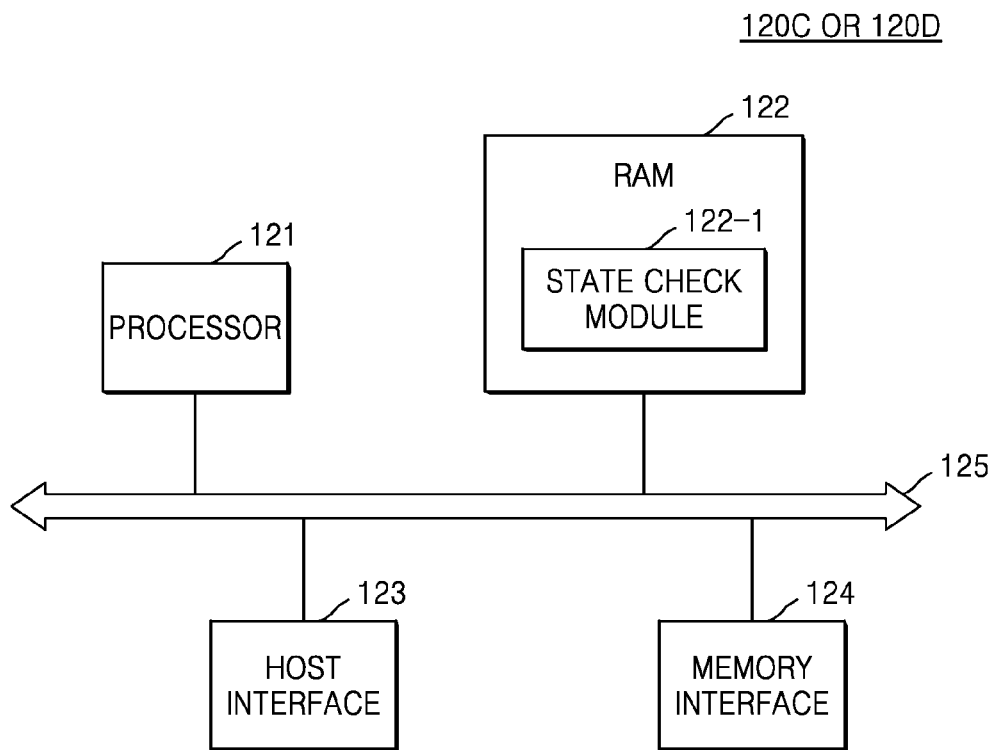
FIG. 21 is a diagram illustrating a configuration of a memory controller of the memory system of FIG. 6 or 7 according to an exemplary embodiment.

FIG. 21 is a diagram illustrating a configuration of the memory controller 120C or 120D of FIG. 6 or 7 according to an exemplary embodiment.

As shown in FIG. 21, the memory controller 120C or 120D includes a processor 121, RAM 122, a host interface 123, a memory interface 124, and a bus 125.

Elements of the memory controller 120C or 120D may be electrically connected to one another through the bus 125.

The processor 121 controls all operations of the memory system 100C or 100D by using a program code and data stored in the RAM 122. For example, the processor 121 may be a microprocessor or a central processing unit (CPU). When the memory system 100C or 100D is initialized, the processor 121 may read a program code and data used to control operations performed by the memory system 100C or 100D from the memory apparatuses 110C-0 through 110C-7 or 110D-0 through 110D-7 and may load the program code and the data to the RAM 122.

A program code of a state check module 122-1 may be stored in the RAM 122. A program used to check an internal state in each of multi-ways through the single RnB pin PX based on at least one of a chip enable signal CE and an initially set function command (e.g., a CE reduction command) may be included in the program code of the state check module 122-1.

A program code about a process performed by a host interface layer HIL and a program code about a process performed by a flash change layer FTL may be loaded to the RAM 122.

The processor 121 may check states of memory apparatuses connected to the memory interface 124 by using the state check module 122-1. For example, the state check module 122-1 may check an individual ready/busy state of each of the memory apparatuses from an RnB signal transmitted through the single RnB pin PX in association with a logic state of a chip enable signal according to the chip enable signal and/or a CE reduction command.

The processor 121 applies a read command and an address during a read operation, applies a program command, an address, and data during a program operation, and applies an erase command an address during an erase operation, to the memory apparatus 110.

The host interface 123 includes a protocol for transmitting/receiving data to/from a host (not shown) that is connected to the memory system 100C or 100D, and connects the memory system 100C or 100D and the host. Examples of the host interface 123 may include an advanced technology attachment (ATA) interface, a serial advanced technology attachment (SATA) interface, a parallel advanced technology attachment (PATA) interface, a universal serial bus (USB), a serial attached small computer system (SAS) interface, a small computer system interface (SCSI), an embedded multimedia card (eMMC) interface, and a universal flash storage (UFS) interface. However, the inventive concept is not limited thereto. The host interface 123 may receive a command, an address, and data from the host or may transmit data to the host under the control of the processor 121.

The memory interface 124 is electrically connected to memory apparatuses. The memory interface 124 may transmit a command, an address, and data to the memory apparatuses or may receive data from the memory apparatuses under the control of the processor 121. The memory interface 124 may be configured to support a NAND flash memory or a NOR flash memory. The memory interface 124 may be configured to perform software or hardware interleaving operations through a plurality of channels. For example, each of the channels may include a plurality of ways.

Figure 22:
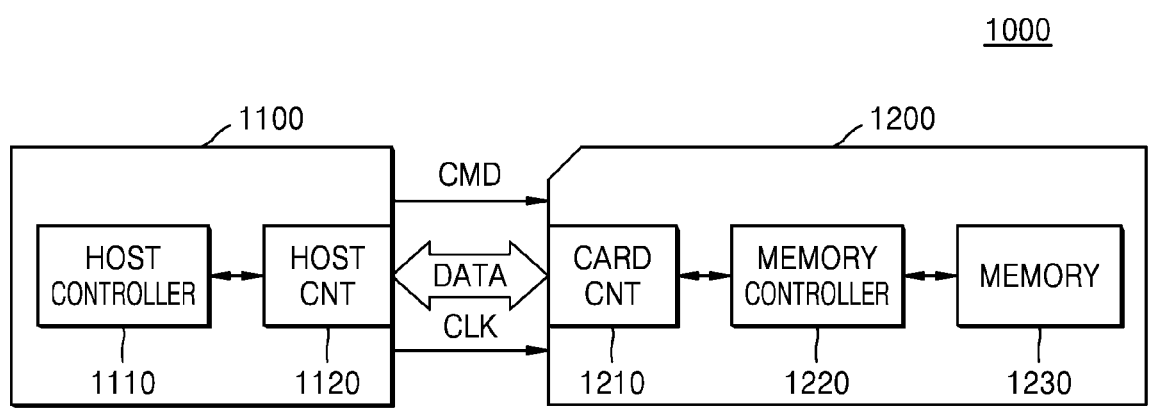
FIG. 22 is a block diagram illustrating an example where a memory system is applied to a memory card system according to an exemplary embodiment.

FIG. 22 is a block diagram illustrating an example where a memory system is applied to a memory card system 1000 according to exemplary embodiments.

Referring to FIG. 22, the memory card system 1000 may include a host 1100 and a memory card 1200. The host 1100 may include a host controller 1110 and a host connector (HOST CNT) 1120. The memory card 1200 may include a card connector (CARD CNT) 1210, a memory controller 1220, and a memory 1230. The memory controller 1220 and the memory 1230 may respectively be the memory controller 120C or 120D, and the memory apparatus 110 of FIG. 6 or 7.

The host 1100 may write data to the memory card 1200 or may read data stored in the memory card 1200. The host controller 1110 may transmit a command CMD, a clock signal CLK generated by a clock generator (not shown) in the host 1100, and data DATA to the memory card 1200 through the host connection unit 1120.

The memory controller 1220 may store data in the memory apparatus 1230 in synchronization with a clock signal generated by a clock generator (not shown) in the memory controller 1220 in response to the command CMD received through the card connection unit 1210. The memory apparatus 1230 may store the data DATA transmitted from the host 1100.

Examples of the memory apparatus 1230 may include a compact flash card (CFC), a microdrive, a smart media card (SMC), a multimedia card (MMC), a security digital card (SDC), a memory stick, and a USB flash memory drive.

Figure 23:
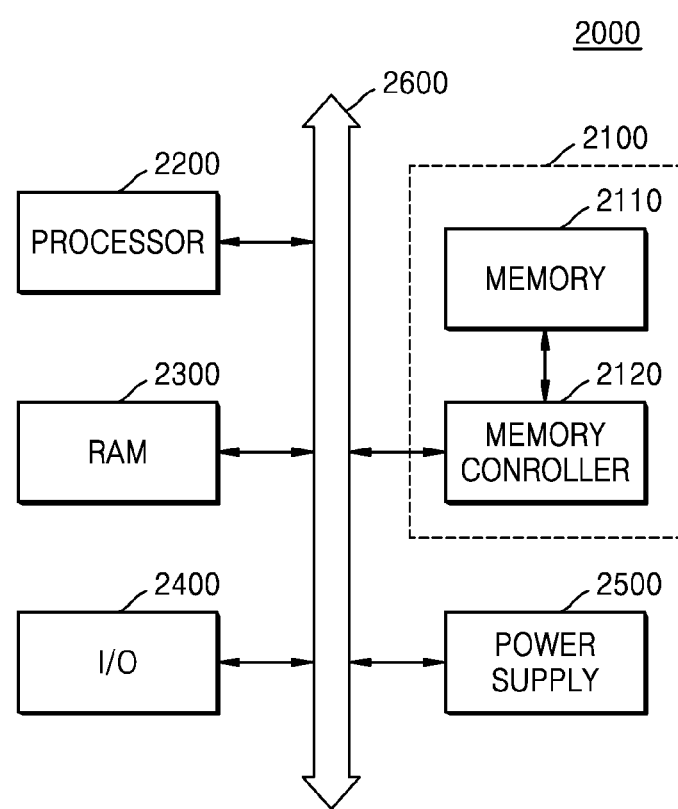
FIG. 23 is a block diagram of a computing system including a memory system according to exemplary embodiments.

FIG. 23 is a block diagram of a computing system 2000 including a memory system 2100, according to exemplary embodiments.

Referring to FIG. 23, the computing system 2000 may include the memory system 2100, a processor 2200, RAM 2300, and input/output (I/O) 2400, and a power supply 2500.

The memory system 2100 includes a memory apparatus 2110 and a memory controller 2120. The memory apparatus 2110 and the memory controller 2120 may be the same as the memory controller 120C or 120D and the memory apparatus 110, respectively, of FIG. 6 or 7.

Although not shown in FIG. 23, the computing system 2000 may further include ports that may communicate with a video card, a sound card, a memory card, or a USB device, or other electronic devices. The computing system 2000 may be a personal computer, or a portable electronic device such as a notebook computer, a mobile phone, a personal digital assistant (PDA), or a camera.

The processor 2200 may perform specific calculations or tasks. In an exemplary embodiment, the processor 2200 may be a microprocessor or a CPU. The processor 2200 may communicate with the RAM 2300, the input/output device 2400, and the memory system 2100 through a bus 2600 such as an address bus, a control bus, or a data bus. According to an exemplary embodiment, the processor 2200 may be connected to an expansion bus such as a peripheral component interconnect (PCI) bus.

The RAM 2300 may store data needed to operate the computing system 2000. Examples of the RAM 2300 may include dynamic random-access memory (DRAM), mobile DRAM, static random-access memory (SRAM), PRAM, FRAM, resistive random-access memory (RRAM), and/or MRAM.

The I/O 2400 may include an input unit such as a keyboard, a keypad, or a mouse, and an output unit such as a display. The power supply 2500 may supply an operating voltage needed to operate the computing system 2000.

Figure 24:
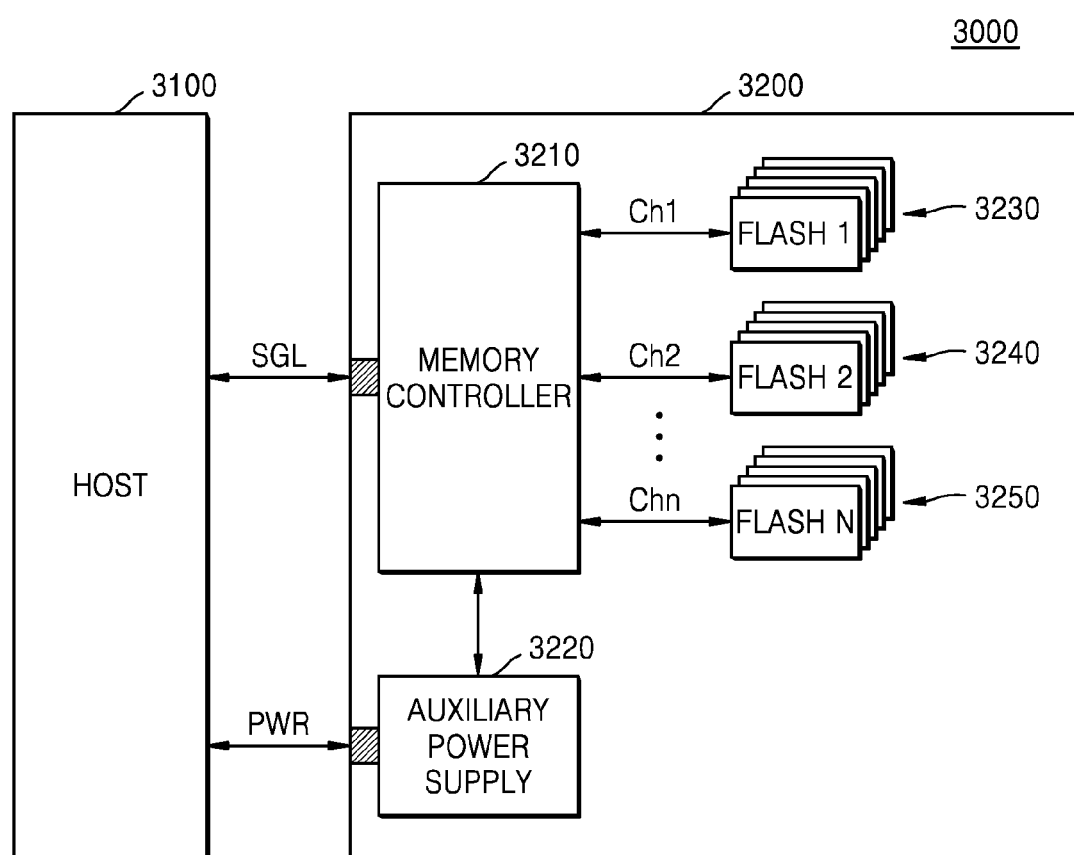
FIG. 24 is a block diagram illustrating an example where a memory system is applied to a solid-state drive (SSD) system according to exemplary embodiments.

FIG. 24 is a block diagram illustrating an example where a memory system is applied to a solid-state drive (SSD) system 3000 according to exemplary embodiments.

Referring to FIG. 24, the SSD system 3000 may include a host 3100 and a solid state drive (SSD) 3200. The SSD 3200 may transmit/receive a signal to/from the host 3100 through a signal connector, and receives power through a power connector (PWR). The SSD 3200 may include a memory controller 3210, an auxiliary power supply 3220, and a plurality of memory apparatuses 3230, 3240, and 3250. The memory controller 3210 and the plurality of memory apparatuses 3230, 3240, and 3250 may be the memory controller 120C or 120D and the memory apparatus 110, respectively, of FIG. 6 or 7.

While the inventive concept has been particularly shown and described with reference to exemplary embodiments thereof by using specific terms, the exemplary embodiments and terms have merely been used to explain the inventive concept and should not be construed as limiting the scope of the inventive concept as defined by the claims. The exemplary embodiments should be considered in a descriptive sense only and not for purposes of limitation. Therefore, the scope of the inventive concept is defined not by the detailed description of the inventive concept but by the appended claims, and all differences within the scope will be construed as being included in the inventive concept.

What is claimed is:

1. A memory system comprising:
a plurality of memory chips in each of which a first state output pin is arranged; and
a memory controller in which a first state input pin connected in a wired-AND configuration to each first state output pin arranged in the plurality of memory chips, the memory controller being configured to transmit at least one of a chip enable signal or an initially set function command to the plurality of memory chips,
wherein each of the plurality of memory chips outputs a first signal having one level from among three logic levels based on at least one of the chip enable signal or the initially set function command, and
wherein the memory controller is further configured to receive a second signal through the first state input pin as a result of an AND operation of first signals output through the first state output pins.

2. The memory system of claim 1, wherein each of the plurality of memory chips configured to be alternately enabled based on the at least one of the chip enable signal or the initially set function command.

3. The memory system of claim 1, wherein the three logic levels include a first level indicating busy state of an enabled memory chip, a second level indicating ready state of the enabled memory chip, and a third level indicating a disabled memory chip.

4. The memory system of claim 3, wherein the third level is a high impedance level.

5. The memory system of claim 1, wherein the three logic levels include a first level indicating pass state of a memory operation of an enabled memory chip, a second level indicating fail state of the memory operation of the enabled memory chip, and a third level indicating a disabled memory chip.

6. The memory system of claim 5, wherein the memory operation is one of a read operation, a program operation and an erase operation.

7. The memory system of claim 1, wherein a second state output pin is further arranged in each of the plurality of memory chips,
wherein the memory controller in which a second state input pin connected in a wired-AND configuration to each second state output pin arranged in the plurality of memory chips,
wherein each of the plurality of memory chips outputs a third signal having one level from among the three logic levels based on the at least one of the chip enable signal or the initially set function command, and
wherein the memory controller is configured to receive a fourth signal through the second state input pin as a result of an AND operation of third signals output through the second state output pins.

8. The memory system of claim 7, wherein the second signal indicates a result of a first memory operation of an enabled memory chip among the plurality of memory chips, and
wherein the fourth signal indicates a result of a second memory operation of the enabled memory chip.

9. The memory system of claim 8, wherein the first memory operation is a read operation, and wherein the second memory operation is a program operation.

10. A memory system comprising:
a plurality of memory chips, each comprising a first state output pin; and
a memory controller connected in a wired-AND configuration to each first state output pin of the plurality of memory chips, the memory controller being configured to transmit at least one of a chip enable signal or an initially set function command to each of the plurality of memory chips,
wherein, in response to receiving an enable signal of the at least one of the chip enable signal or the initially set function command, the memory chip outputs a first signal indicating a first state of the memory chip to the first state output pin, and in response to receiving a disable signal of the at least one of the chip enable signal or the initially set function command, the memory chip outputs the first signal having a high impedance level,
wherein a second state output pin is further arranged in each of the plurality of memory chips,
wherein the memory controller is further connected in a wired-AND configuration to each second state output pin arranged in the plurality of memory chips,
wherein, in response to receiving the enable signal, the memory chip further outputs a second signal indicating a second state of the memory chip to the second state output pin, and in response to receiving the disable signal, the memory chip further outputs the second signal having a high impedance level.

11. The memory system of claim 10, wherein the memory controller comprises a first state input pin that is connected in a wired-AND configuration to each first state output pin of the plurality of memory chips.

12. The memory system of claim 10, wherein the memory controller is further configured to receive a second signal as a result of an AND operation of first signals output through the first state output pins.

13. The memory system of claim 10, wherein the first state of the memory chip is one of a ready/busy state, a program pass/fail state, or a read pass/fail state.

14. The memory system of claim 10, wherein the memory controller further comprises a second state input pin that is connected in a wired-AND configuration to each second state output pin of the plurality of memory chips.

15. The memory system of claim 10, wherein the memory controller is further configured to receive a fourth signal as a result of an AND operation of third signals output through the second state output pins.

16. The memory system of claim 10, wherein a first memory operation associated with the first state of the memory chip is different from a second memory operation associated with the second state of the memory chip.

17. A memory system comprising:
a plurality of memory chips, each comprising a first state output pin and a second state output pin; and
a memory controller connected in a first wired-AND configuration to each first state output pin of the plurality of memory chips and connected in a second wired-AND configuration to each second state output pin of the plurality of memory chips, the memory controller being configured to transmit a chip enable signal to the plurality of memory chips to alternately enable the plurality of memory chips;
wherein the memory controller is further configured to receive a second signal as a first result of a first AND operation of first signals output through the first state output pins and a fourth signal as a second AND operation of second signals output through the second state output pins, and determine heterogeneous states of an enabled memory chip among the plurality of memory chips based on the second signal and the fourth signal.

18. The memory system of claim 17, wherein the second signal indicates a result of a first memory operation of the enabled memory chip, and
wherein the fourth signal indicates a result of a second memory operation of the enabled memory chip.

19. The memory system of claim 18, wherein the first memory operation is a read operation, and
wherein the second memory operation is a program operation.

* * * * *